United States Patent
Iwakuma et al.

(10) Patent No.: US 7,576,486 B2
(45) Date of Patent: Aug. 18, 2009

(54) ORGANIC ELECTROLUMINESCENCE ELEMENT HAVING TWO ELECTROLUMINESCENT LAYERS THROUGH ELECTRON BARRIER LAYER

(75) Inventors: Toshihiro Iwakuma, Sodegaura (JP); Masahide Matsuura, Sodegaura (JP); Hiroshi Yamamoto, Sodegaura (JP); Hisayuki Kawamura, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 185 days.

(21) Appl. No.: 10/567,903

(22) PCT Filed: Mar. 24, 2005

(86) PCT No.: PCT/JP2005/005397

§ 371 (c)(1),
(2), (4) Date: Aug. 24, 2006

(87) PCT Pub. No.: WO2005/099313

PCT Pub. Date: Oct. 20, 2005

(65) Prior Publication Data

US 2007/0188083 A1    Aug. 16, 2007

(30) Foreign Application Priority Data

Apr. 2, 2004  (JP) ............................. 2004-109651

(51) Int. Cl.
*H01J 1/62* (2006.01)
*H01J 63/04* (2006.01)

(52) U.S. Cl. .................. 313/506; 313/505; 313/504; 313/503; 313/483; 428/690; 428/917

(58) Field of Classification Search .................. None
See application file for complete search history.

(56) References Cited

U.S. PATENT DOCUMENTS

| 5,891,554 | A  | * | 4/1999  | Hosokawa et al. | .......... 313/506 |
| 7,009,338 | B2 | * | 3/2006  | D'Andrade et al. | ......... 313/504 |
| 7,034,339 | B2 | * | 4/2006  | Matsuura et al. | .............. 257/72 |
| 2003/0059647 | A1 | | 3/2003 | Thompson et al. | |
| 2004/0032214 | A1 | | 2/2004 | Lee et al. | |
| 2007/0090753 | A1 | * | 4/2007 | Arakane | ...................... 313/504 |
| 2007/0103065 | A1 | * | 5/2007 | Fukuoka et al. | ............. 313/506 |
| 2007/0275266 | A1 | * | 11/2007 | Jinde et al. | .................. 428/690 |

FOREIGN PATENT DOCUMENTS

EP    1 434 284 A2    6/2004

(Continued)

OTHER PUBLICATIONS

U.S. Appl. No. 12/037,511, filed Feb. 26, 2008, Kawamura et al.

(Continued)

*Primary Examiner*—Nimeshkumar D. Patel
*Assistant Examiner*—Natalie K Walford
(74) *Attorney, Agent, or Firm*—Oblon, Spivak, McClelland, Maier & Neustadt, P.C.

(57) ABSTRACT

An organic electroluminescent device including a pair of electrodes, and at least two organic emitting layers held between the pair of electrodes, (1) two organic emitting layers being arranged with an electron barrier layer interposed therebetween, (2) the two organic emitting layers both including an electron-transporting emitting material.

14 Claims, 2 Drawing Sheets

FOREIGN PATENT DOCUMENTS

| | | |
|---|---|---|
| EP | 1 667 494 A1 | 6/2006 |
| EP | 1 729 544 A1 | 12/2006 |
| EP | 1 755 362 A1 | 2/2007 |
| JP | 08-078163 | 3/1996 |
| JP | 8-315986 | 11/1996 |
| JP | 2000-68057 | 3/2000 |
| JP | 2001-052870 | 2/2001 |
| JP | 2004-6165 | 1/2004 |
| JP | 2004-522276 | 7/2004 |
| JP | 2005-100921 | 4/2005 |
| WO | WO 99/52992 | 10/1999 |
| WO | WO 02/091814 A2 | 11/2002 |
| WO | WO 2004/060027 A1 | 7/2004 |
| WO | WO 2004/061878 A2 | 7/2004 |
| WO | WO 2004/082338 A1 | 9/2004 |

OTHER PUBLICATIONS

U.S. Appl. No. 10/588,773, filed Aug. 8, 2006, Iwakuma et al.
U.S. Appl. No. 11/480,465, filed Jul. 5, 2006, Iwakuma et al.
U.S. Appl. No. 11/480,463, filed Jul. 5, 2006, Iwakuma et al.
U.S. Appl. No. 10/590,076, filed Aug. 21, 2006, Kawamura et al.
Shizuo Tokito, et al., "High-efficiency white phosphorescent organic light-emitting devices with greenish-blue and red-emitting devices with greenish-blue and red-emitting layers", Applied Physics Letters, vol. 83, No. 12, Sep. 22, 2003, pp. 2459-2461.

* cited by examiner (a)

(b)

(c)

(d)

(e)

(f)

ORGANIC ELECTROLUMINESCENCE ELEMENT HAVING TWO ELECTROLUMINESCENT LAYERS THROUGH ELECTRON BARRIER LAYER

TECHNICAL FIELD

The invention relates to an organic electroluminescent device (hereinafter abbreviated as organic EL device). In particular, it relates to an organic EL device capable of being driven with low voltage and emitting white light at high efficiency.

BACKGROUND ART

Recently, white (white-light-emitting) organic EL devices are being actively developed because they can be used for a mono-color display device, a lighting apparatus such as a back light, and a full-color display with color filters. Chromaticity change in the white organic EL device not only impairs the quality of the product, but also causes decrease of color reproducibility in, for instance, a full-color display which is combined with color filters. Therefore, minimal chromaticity change is required for the white organic EL devices.

Many methods of producing white light emission by an organic EL device have been proposed. Few of the methods produce white light with only one kind of emitting material and a single organic EL device generally uses two or more kinds of emitting materials that emit light simultaneously. In the case of using three kinds of emitting materials, a combination of red, blue and green lights corresponding to three primary colors gives white light. However, there are problems that such organic EL devices have difficulty controlling chromaticity and that they are poor in reproducibility. In the case of using two kinds of emitting materials, a blue emitting material and a yellow-to-red emitting material, yellow-to-red being the complementary color to blue, are selected. However, the yellow-to-red light emission becomes dominant in many cases, and chromaticity change tends to occur. For instance, as shown in reference examples 1 and 2 of Patent Document 1, blue emission tends to be lowered in conventional white organic EL devices and they have problem in the point of chromaticity change. Further, a blue dopant and a yellow-to-red dopant are used together and the doping ratio thereof can be adjusted to give white light emission. However, in addition to the tendency for red to become dominant, energy is liable to transfer from blue to red so as to give reddish white light. Therefore, in order to obtain white light, a yellow-to-red dopant has to be used in a considerably diluted manner, so that there is a problem in the point of reproducibility.

In another method, a yellow-to-red emitting material is doped into the hole-transporting layer adjacent to the emitting layer. In this method, electrons are not easily injected into the hole-transporting layer so that even when doping with a yellow-to-red emitting material toward which the light emission tends to shift is conducted, strong red light emission does not occur. Thus, this method has advantages in that it is easy to balance the blue light emission and the yellow to red light emission in order to obtain white light emission and that the resultant organic EL device is excellent in luminous efficiency and has a long lifetime. However, in view of the problem that energy transmission depends upon distance, there has been a critical issue that extensive chromaticity change is observed after the organic EL device has been driven continuously or it has been kept under a high temperature condition. It is the inventors' understanding that the balance of electrons and holes breaks down with degeneration because excited red emitting molecules concentrate at the interface of the hole-transporting layer side, and even if the extent of the concentration to the interface changes slightly, red light emission changes significantly while blue light emission does not change much. This is the cause of chromaticity change.

Further, there is a stacked type organic EL device which has two emitting layers and in which the emitting layer at the anode side is a yellow-to-red emitting layer and the one at the cathode side is a blue emitting layer. Although this type is excellent in efficiency, it requires control of the yellow to red light emission in order to obtain white light emission. For this, it is necessary for the thickness of the yellow-to-red emitting layer to be made thinner than that of the blue emitting layer, or for the doping concentration of the yellow-to-red emitting material to be lowered, so that fabrication of such a device is difficult. Concretely, unless the thickness of the yellow-to-red emitting layer is made approximately 1 to 2 nm, white light emission cannot be obtained in many cases. Such a thickness is almost the same as the size of the molecules used in typical low molecular type organic EL devices, and it is very difficult to control the thickness to this value.

On the other hand, by making the emitting layer on the anode side, toward which color range of the emitted light is liable to shift, a blue emitting layer, the tendency of the emitted light color to shift to red is counteracted, white light emission can be obtained and chromaticity change during driving is less, even when the yellow-to-red emitting layer is given a thickness of approximately 10 to 30 nm. However, in view of practical use, a stable white organic EL device is desired whose chromaticity change is even smaller.

Patent Document 1: JP-A-2001-52870

An object of the invention is to provide an organic EL device which is stable and small in chromaticity change, can be driven with low voltage and has high efficiency.

DISCLOSURE OF THE INVENTION

Focusing on the above-mentioned problems, the inventors found that a white organic EL device small in chromaticity change can be obtained by forming an electron barrier layer between two emitting layers and causing emission of light at the interface at an anode side of the emitting layer located at the anode side relative to the electron barrier layer and emission of light at the interface at a cathode side of the electron barrier layer, thereby simplifying control of the color range of the light emission to provide a white light organic EL device with less chromaticity change. The invention was accomplished based on this finding.

According to the invention, the following organic EL device and display can be provided.

[1] An organic electroluminescent device comprising a pair of electrodes, and at least two organic emitting layers held between the pair of electrodes, (1) two organic emitting layers being arranged with an electron barrier layer interposed therebetween, (2) the two organic emitting layers both comprising an electron-transporting emitting material.

[2] The organic electroluminescent device according to [1], wherein the two organic emitting layers both have an electron mobility of $10^{-6}$ cm$^2$/V·sec or more.

[3] The organic electroluminescent device according to [1] or [2], wherein the electron barrier layer has an affinity level of at least 0.2 eV less than the affinity level of the organic emitting layer arranged on a cathode side relative to the electron barrier layer

[4] The organic electroluminescent device according to any one of [1] to [3], wherein a difference in ionization potential between the electron barrier layer and the organic emitting layer arranged on an anode side relative to the electron barrier layer is 0.2 eV or less.

[5] The organic electroluminescent device according to any one of [1] to [4], wherein a difference in ionization potential between the electron barrier layer and the organic emitting layer arranged on a cathode side relative to the electron barrier layer is 0.2 eV or less.

[6] The organic electroluminescent device according to any one of [1] to [5], wherein the organic emitting layer arranged on an anode side relative to the electron barrier layer emits blue light.

[7] The organic electroluminescent device according to any one of [1] to [6], wherein the organic emitting layer arranged on a cathode side relative to the electron barrier layer emits yellow to red light.

[8] The organic electroluminescent device according to any one of [1] to [5], wherein the organic emitting layer arranged on an anode side relative to the electron barrier layer emits yellow to red light.

[9] The organic electroluminescent device according to any one of [1] to [5] and [8], wherein the organic emitting layer arranged on a cathode side relative to the electron barrier layer emits blue light.

[10] The organic electroluminescent device according to any one of [6] to [9], wherein the maximum wavelength of the blue light is 450 nm to 500 nm.

[11] The organic electroluminescent device according to any one of [6] to [9], wherein the maximum wavelength of the yellow to red light is 540 nm to 700 nm.

[12] The organic electroluminescent device according to any one of [1] to [11] that emits white light.

[13] A display comprising the organic electroluminescent device of any one of [1] to [12].

According to the invention, a white light emitting device with a simple structure can be obtained by interposing an electron barrier layer between two emitting layers. In particular, high efficiency can be attained by making the ionization potential of the electron barrier layer to a level near to the level of the emitting layer. Further, a white light emitting device having a high efficiency can be obtained even when emitting layers of phosphorescence type are employed.

BEST MODE FOR CARRYING OUT THE INVENTION

The invention will now be explained in detail.

The organic electroluminescent device of the invention comprises:

a pair of electrodes, and at least two organic emitting layers held between the pair of electrodes, (1) two organic emitting layers being arranged with an electron barrier layer interposed therebetween, (2) the two organic emitting layers both comprising an electron-transporting emitting material.

In the organic EL device of the invention, at least two emitting layers are formed, and the electron barrier layer is interposed between specific two emitting layers among the at least two emitting layers. Further, three emitting layers (first, second and third emitting layers) are formed, and a first electron barrier layer may be formed between the first and second emitting layers, and a second electron barrier layer between the second and the third emitting layers. Although in the following description the invention will be explained with reference to embodiments in which an electron barrier layer and specific two emitting layers are formed, the invention is not limited to these embodiments at all.

Figure 1:
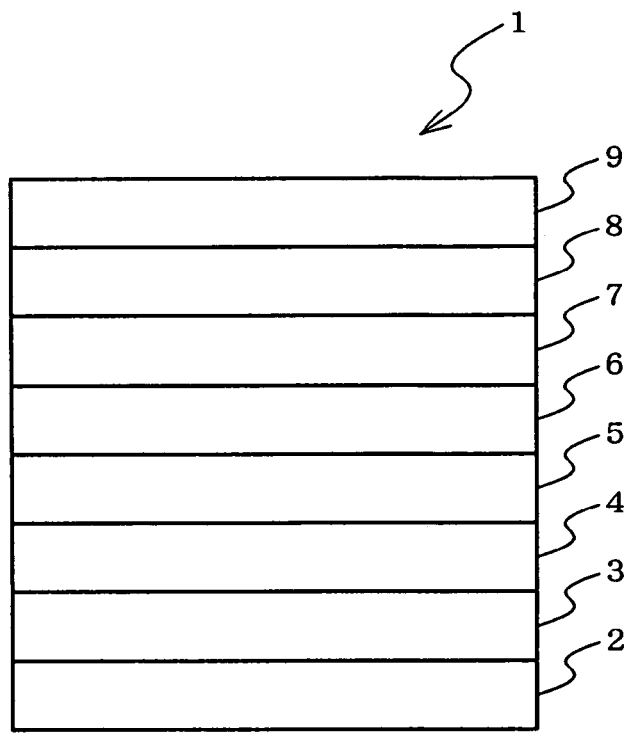
FIG. 1 is a schematic view of one embodiment of the organic EL device of the invention.
Figure 2:
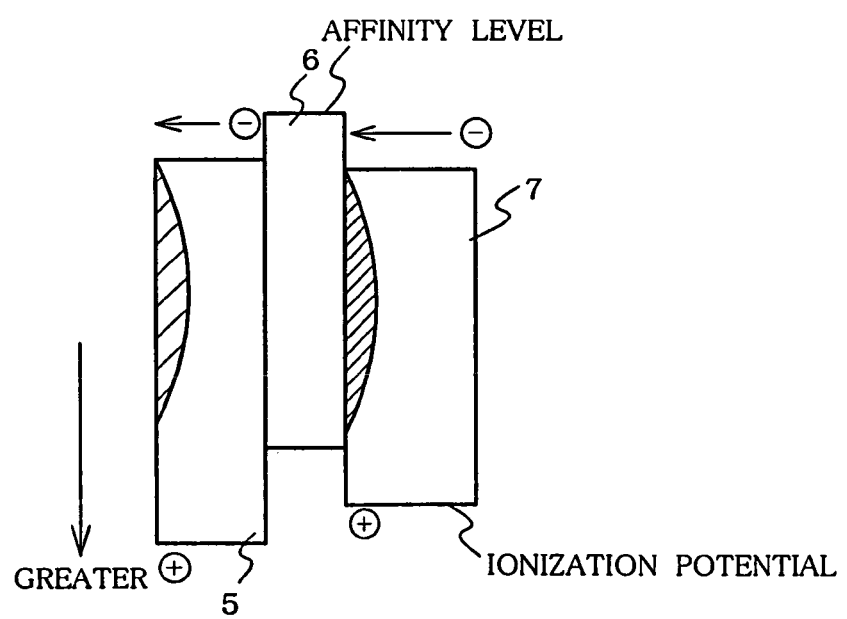
FIG. 2 is a diagram representing energy level of the electron barrier layer (essential constitution layer) of the organic EL device of the invention.

First, the characteristic features of the invention will be explained with reference to FIGS. 1 and 2. FIG. 1 is a drawing which shows a typical device structure of one embodiment of the organic EL device of the invention. FIG. 2 is a diagram which represents energy levels of the interfaces of the electron barrier layer of the organic EL device in contact with the adjacent layers.

The organic EL device 1 of the invention includes an anode 2, anode-side emitting layer 5 comprising an electron-transporting emitting material, electron barrier layer 6, cathode-side emitting layer 7 comprising an electron-transporting emitting material and cathode 9 as essential components. Further, a hole-injecting layer 3 formed between the anode 1 and the anode-side emitting layer 5, a hole-transporting layer 4, an electron-transporting layer 8 formed between the cathode-side emitting layer 7 and cathode 9 and other layers are interposed layers optionally disposed between essential layers.

The structure of the organic EL device of the invention is not limited to the one indicated in FIG. 1, and, for example, the following configurations are also possible:

anode/blue emitting layer/electron barrier layer/yellow-to-red emitting layer/cathode, anode/yellow-to-red emitting layer/electron barrier layer/blue emitting layer/cathode, anode/hole-transporting layer/blue emitting layer/electron barrier layer/yellow-to-red emitting layer/cathode, anode/hole-transporting layer/yellow-to-red emitting layer/electron barrier layer/blue emitting layer/cathode, anode/hole-transporting layer/blue emitting layer/electron barrier layer/yellow-to-red emitting layer/electron-transporting layer/cathode, anode/hole-transporting layer/yellow-to-red emitting layer/electron barrier layer/blue emitting layer/electron-transporting layer/cathode, anode/hole-injecting layer/hole-transporting layer/blue emitting layer/electron barrier layer/yellow-to-red emitting layer/electron-transporting layer/cathode, anode/hole-injecting layer/hole-transporting layer/yellow-to-red emitting layer/electron barrier layer/blue emitting layer/electron-transporting layer/cathode, anode/hole-injecting layer/hole-transporting layer/blue emitting layer/electron barrier layer/yellow-to-red emitting layer/electron-transporting layer/electron-injecting layer/cathode, anode/hole-injecting layer/hole-transporting layer/yellow-to-red emitting layer/electron barrier layer/blue emitting layer/electron-transporting layer/electron-injecting layer/cathode. The structure of the organic EL device of the invention is not particularly limited so long as an electron barrier layer is arranged between the two emitting layers composed of electron-transporting material.

Also, to make the organic EL device of the invention operate as a white organic EL device, the structure thereof is not particularly limited so long as an electron barrier layer is arranged between a blue emitting layer and a yellow-to-red emitting layer.

The invention is characterized in that the two organic emitting layers arranged with the electron barrier layer interposed therebetween are both composed of an electron-transporting emitting material. The relationship of energy levels between the layers in this case will be explained with reference to FIG. 2. In FIG. 2, the upper side indicates the affinity level of electrons and the lower side the ionization potential. In the energy level diagram, lower side means a larger energy value.

In FIG. 2, electrons from the cathode flow into the cathode-side emitting layer 7 composed of an electron-transporting material and are transported toward the anode. However, the electron current is blocked at the interface between the cathode-side emitting layer 7 and electron barrier layer 6 which has an affinity level lower than that of the cathode-side emitting layer 7, and the electrons concentrate at the interface. Some of the electrons from the cathode flow into the anode-side emitting layer 5 beyond the electron barrier layer 6, and the anode-side emitting layer 5 having electron transporting property transports them toward the anode. These electrons arrive at the anode-side interface of the anode-side emitting layer 5 and meet holes from the anode at the anode-side interface of the anode-side emitting layer 5 to generate emission at this position. Further, there are holes which pass through the anode-side emitting layer 5 and move to the interface between the electron barrier layer 6 and the cathode-side emitting layer 7, and these holes meet with the electrons concentrated at the interface of the cathode-side emitting layer 7 at the side of the electron barrier layer 6 (anode-side interface of the cathode-side emitting layer 7) to generate emission.

In the organic EL device of the invention, emission is generated at two positions of the anode-side interface of the anode-side emitting layer 5 and the anode-side interface of the cathode-side emitting layer 7. And, one of the two emitting layers generates blue light emission and other emitting layer yellow-to-red light emission, whereby white light emission can be obtained.

The organic EL device of the invention includes at least two organic emitting layers between the anode and the cathode, and an electron barrier layer is held between two emitting layers of the at least two emitting layers. By such a structure of the organic EL device of the invention, light emissions generated from the two emitting layers can easily be controlled to generate more stable light emission.

In the case where the organic EL device of the invention is caused to generate white light emission, by interposing a layer which blocks electron (electron barrier layer) between two emitting layers, light emissions are generated at respective interfaces of the above-mentioned two emitting layers. Therefore, in order to obtain white light emission, blue light emission and yellow-to-red light emission are generated in good balance, and thus, there is no need for any one of emitting layers to be made extremely small in thickness or extremely low in doping concentration. As a result, the two emitting layers emit light stably so that chromaticity change can be minimized. Thus, the white organic EL device of the invention achieves lower chromaticity change, particularly under a high temperature circumstances or when it is driven continuously. Therefore, the organic EL device of the invention can suitably be used for information display devices, vehicle-mounted display devices, lighting apparatuses and the like.

In the invention, the electron mobilities of the two organic emitting layers arranged with the electron barrier layer interposed therebetween are preferably $10^{-6}$ cm$^2$/Vs or above, more preferably $10^{-5}$ cm$^2$/Vs or above. When the electron mobilities of these emitting layers are lower than $10^{-6}$ cm$^2$/Vs, light emission from the anode-side emitting layer may sometimes be significantly degraded.

In the invention, in order to make the layer held between the two organic emitting layers function as an electron barrier layer, this layer (electron barrier layer) has to be constituted of a material having an affinity level lower than that of the material constituting the cathode-side emitting layer and preferably an affinity level lower than that of the material of the cathode-side emitting layer by 0.2 eV or more. When the affinity level of the electron barrier layer is larger than that of the cathode-side emitting layer by less than 0.2 eV, the driving voltage may sometimes undesirably increase significantly.

In the invention, difference in ionization potential between the electron barrier layer and the organic emitting layer located at an anode side relative to the electron barrier layer (hereinafter sometimes referred to as anode-side emitting layer) is preferably 0.2 eV or less, more preferably 0.1 eV or less. When the difference is larger than 0.2 eV, the light emission from one of the emitting layers may sometimes be lost.

In the invention, difference in ionization potential between the electron barrier layer and the cathode-side emitting layer is preferably 0.2 eV or less, more preferably 0.1 eV or less. When the difference is larger than 0.2 eV, emission from one of the emitting layers may sometimes be lost, or the driving voltage may increase significantly.

Since it is a difference in ionization potential, the one of the electron barrier layer and the anode-side emitting layer and the one of the electron barrier layer and the cathode-side emitting layer that has higher ionization potential than the other can be either thereof.

In the invention, the light color generated from each emitting layer is not particularly limited and can suitably be selected so that the organic EL device takes on desired color of light emission. When white light is required, it is preferred that light from one emitting layer has blue color and that from another emitting layer has yellow-to-red color. Here, the maximum wave length of the blue light is preferably 450 to 500 nm, and that of the yellow-to-red light is preferably 540 to 700 nm.

Further, when two emitting layers which are a blue emitting layer and a yellow-to-red emitting layer are held between an anode and a cathode, a white organic EL device having of reduced chromaticity change can be obtained by interposing an electron barrier layer between the two emitting layers.

Preferably, a first organic layer composed of a hole-transporting material is interposed between the anode and the blue emitting layer (anode-side emitting layer) and may contain an oxidizing agent. Preferably, a second organic layer composed of an electron-transporting material is interposed between the cathode and the yellow-to-red emitting layer (cathode-side emitting layer) and may contain a reducing agent. Preferably, an inorganic compound layer is included in contact with the anode and/or the cathode.

The host material of the organic emitting layer has electron transporting property. As such host material having electron transporting property, a host material having electron transporting property which can be used for the organic emitting layer, can be used with no particular limitation. Further, the host material constituting the anode-side emitting layer and the cathode-side emitting layer may be the same or different.

Host materials having electron transporting property usable in the invention include styryl derivatives, arylene derivatives, aromatic amines, and 8-hydroxyquinoline and its derivatives. The styryl derivatives include distyryl derivatives, tristyryl derivatives, tetrastyryl derivatives and styrylamine derivatives. The arylene derivatives include anthracene derivatives, and particularly compounds having an arylanthracene structure. The aromatic amines include compounds having 2, 3 or 4 nitrogen atoms which are substituted by aromatic group, preferably compounds having at least one alkenyl group. Of these, preferred are compounds having high electron transporting property such as anthracene derivatives, and 8-hydroquinoline and its derivatives.

In the invention, since the emitting layers are constituted of an electron-transporting material, electrons which to flow easily mainly in the emitting layers are partially stemmed at the interface of the electron barrier layer side of the cathode-side emitting layer by the electron barrier layer, to emit a first color light at this position. Further, electrons which reach the anode-side emitting layer beyond the electron barrier layer and which flow easily mainly in the anode-side emitting layer constituted of an electron-transporting material, meet with holes at the anode side interface of the anode-side emitting layer, or the interface between the hole-transporting layer and the anode-side emitting layer, thereby emitting a second color light.

As a blue dopant used for a blue emitting layer, there may be used, for example, at least a compound selected from the group consisting of styrylamine, amine-substituted styryl compounds and condensed aromatic ring-containing compounds, but it is not limited thereto. The blue dopant preferably has a fluorescent peak in the range of 450 to 500 nm.

As a yellow-to-red dopant used for a yellow-to-red emitting layer, there may be used, for example, compounds having a plurality of fluoranthene structures, but it is not limited thereto. The yellow-to-red dopant is preferably a compound having an electron-donating group and fluoranthene structures, and preferably has a fluorescent peak at 540 to 700 nm, more preferably 550 to 650 nm. In order to have a blue emitting layer and a yellow-to-red emitting layer function as emitting layers giving sufficient (good) luminous efficiency, each emitting layer preferably has a thickness of 5 nm or more.

In a case of making the organic EL device of the invention generate white light emission, a blue emitting layer and a yellow-to-red emitting layer are arranged between an anode and a cathode with an electron barrier layer interposed therebetween. Further, in the case of a white organic EL device, other intervening layers each composed of an organic or inorganic material may be stacked between an anode and an anode-side emitting layer (preferably blue emitting layer) or a cathode-side emitting layer (preferably yellow-to-red emitting layer) and a cathode. Such intervening layers are not limited so long as they are transparent and can transport electrons and holes. Preferred materials for constituting such intervening layers include indium oxide, tin oxide, zinc oxide, zinc sulfide, cadmium sulfide and gallium nitride.

Hereinbelow, the organic EL device of the invention will be explained with focus on the characteristics of the blue emitting layer, yellow-to-red emitting layer and electron barrier layer in the case where it is a white organic EL device. The constitutions and methods of preparation of other organic layers, intervening layers such as inorganic compound layers, an anode, a cathode and the like will be explained briefly since they can employ general constitutions.

1. Emitting Layer
(1) Blue Emitting Layer

In the invention, any one of two emitting layers between which an electron barrier layer is interposed may be a blue emitting layer, but the anode-side emitting layer is preferably a blue emitting layer.

A blue emitting layer is preferably a layer which emits light with a maximum wavelength of 450 to 500 nm and preferably made of a host material and a blue series dopant. The host material is preferably a styryl derivative, arylene derivative or aromatic amine. The styryl derivative is particularly preferably at least one kind selected from distyryl, tristyryl, tetrastyryl and styryl amine derivatives. The arylene derivative is particularly preferably an anthracene derivative, especially a compound containing an arylanthracene structure. The aromatic amine is preferably a compound containing 2 to 4 nitrogen atoms substituted with an aromatic group. Particularly preferred are a compound containing 2 to 4 nitrogen atoms substituted with an aromatic group and at least one alkenyl group.

The styryl and anthracene derivatives include compounds represented by the following formulas [1] to [6] and the aromatic amines include compounds represented by the following formulas [7] to [8].

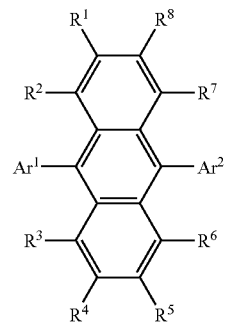

[1]

wherein $R^1$ to $R^8$ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; and $Ar^1$ and $Ar^2$ are independently a substituted or unsubstituted aryl group with 6 to 30 carbon atoms or a substituted or unsubstituted alkenyl group, a substituent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms.

[2]

wherein R¹ to R¹⁰ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; Ar¹ and Ar² are independently a substituted or unsubstituted aryl group with 6 to 30 carbon atoms or a substituted or unsubstituted alkenyl group; and the substitutent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted heterocyclic group with 5 to 30 carbon atoms.

[3]

wherein R¹ to R¹⁰ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; Ar³ and Ar⁴ are independently a substituted or unsubstituted aryl group with 6 to 30 carbon atoms or a substituted or unsubstituted alkenyl group; the substitutent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms, a substituted or unsubstituted heterocyclic group with 5 to 30 carbon atoms or a substituted or unsubstituted alkenyl group with 4 to 40 carbon atoms; l is 1 to 3, m is 1 to 3 and l+m is 2 or more.

[4]

wherein R¹ to R⁸ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted heterocyclic group with 5 to 30 carbon atoms; Ar³ and Ar⁴ are independently a substituted or unsubstituted aryl group with 6 to 30 carbon atoms or a substituted or unsubstituted alkenyl group; and the substitutent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms, a substituted or unsubstituted heterocyclic group with 5 to 30 carbon atoms or a substituted or unsubstituted alkenyl group with 4 to 40 carbon atoms.

[5]

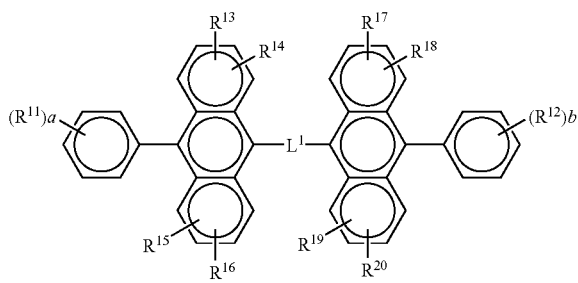

wherein $R^{11}$ to $R^{20}$ are independently a hydrogen atom, an alkenyl group, an alkyl group, a cycloalkyl group, an aryl group, an alkoxy group, an aryloxy group, an alkylamino group, an arylamino group or a substituted or unsubstituted heterocyclic group; a and b are each an integer of 1 to 5; when they are 2 or more, $R^{11}$s or $R^{12}$s may be the same or different, or $R^{11}$s or $R^{12}$s may be bonded together to form a ring; $R^{13}$ and $R^{14}$, $R^{15}$ and $R^{16}$, $R^{17}$ and $R^{18}$, or $R^{19}$ and $R^{20}$ may be bonded together to form a ring; and $L^1$ is a single bond, —O—, —S—, —N(R)— (R is an alkyl group or a substituted or unsubstituted aryl group) or an arylene group.

[6]

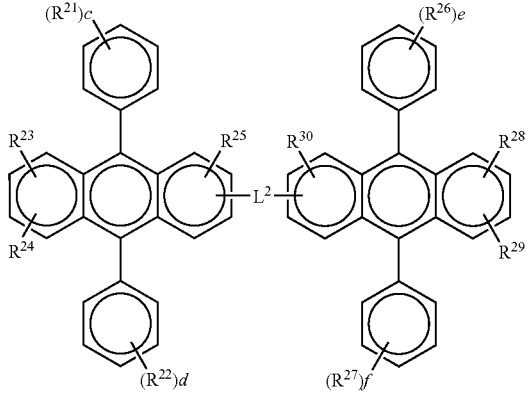

wherein $R^{21}$ to $R^{30}$ are independently a hydrogen atom, an alkenyl group, an alkyl group, a cycloalkyl group, an aryl group, an alkoxy group, an aryloxy group, an alkylamino group, an arylamino group or a substituted or unsubstituted heterocyclic group; c, d, e and f are each an integer of 1 to 5; when they are 2 or more, $R^{21}$s, $R^{22}$s, $R^{26}$s or $R^{27}$s may be the same or different, $R^{21}$s, $R^{22}$s, $R^{26}$s or $R^{27}$s may be bonded together to form a ring, or $R^{23}$ and $R^{24}$, or $R^{28}$ and $R^{29}$ may be bonded together to form a ring; and $L^2$ is a single bond, —O—, —S—, —N(R)— (R is an alkyl group or a substituted or unsubstituted aryl group) or an arylene group.

[7]

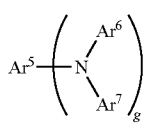

wherein $Ar^5$, $Ar^6$ and $Ar^7$ are independently a substituted or unsubstituted monovalent aromatic group with 6 to 40 carbon atoms, at least one of them may include a styryl group and g is an integer of 1 to 4.

[8]

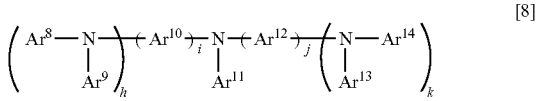

wherein $Ar^8$, $Ar^9$, $Ar^{11}$, $Ar^{13}$ and $Ar^{14}$ are independently a substituted or unsubstituted monovalent aromatic group with 6 to 40 carbon atoms, $Ar^{10}$ and $Ar^{12}$ are independently a substituted or unsubstituted divalent aromatic group with 6 to 40 carbon atoms, at least one from $Ar^8$ to $Ar^{14}$ may include a styryl group or styrylene group, h and k are each an integer of 0 to 2 and i and j are each an integer of 0 to 3.

A blue dopant is preferably at least one selected from styrylamines, amine-substituted styryl compounds and compounds containing fused aromatic rings. A blue dopant may comprise multiple kinds of compounds. Examples of the above-mentioned styryl amines and amine-substituted styryl compounds are compounds represented by the general formulas [9] to [10] and examples of the above-mentioned compounds containing fused aromatic rings are compounds represented by the general formula [11].

[9]

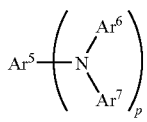

wherein $Ar^5$, $Ar^6$, and $Ar^7$ are independently a substituted or unsubstituted aromatic group with 6 to 40 carbon atoms; at least one of them includes a styryl group and p is an integer of 1 to 3.

[10]

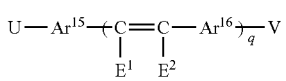

wherein $Ar^{15}$ and $Ar^{16}$ are independently an arylene group with 6 to 30 carbon atoms; $E^1$ and $E^2$ are independently an aryl or alkyl group with 6 to 30 carbon atoms, a hydrogen atom, or a cyano group; q is an integer of 1 to 3; U and/or V are a substituent including an amino group and the amino group is preferably an arylamino group.

[11]

wherein A is an alkyl group or an alkoxy group with 1 to 16 carbon atoms, a substituted or unsubstituted aryl group with 6 to 30 carbon atoms, a substituted or unsubstituted alkylamino group with 6 to 30 carbon atoms, a substituted or unsubstituted arylamino with 6 to 30 carbon atoms and B is a fused aromatic ring group with 10 to 40 carbon atoms; and r is an integer of 1 to 4.

As a blue emitting layer, a phosphorescent compound can be used. The preferred phosphorescent compound is a compound that is a host material containing a carbazole ring.

The hosts, which are composed of compounds containing a carbazole ring, suitable for phosphorescent emission are compounds causing the phosphorescent emitting compound to emit phosphorescence due to the energy movement from the exited state to the phosphorescent emitting compound. The host compound is not limited so long as compounds able to move the exciter energy to the phosphorescent emitting compound, and may arbitrarily be selected. The host compound may have any hetero rings or the like other than the carbazole ring.

Examples of the host compounds suitable for phosphorescence emission include carbazole, triazole, oxazole, oxadiazole, imidazole, polyarylalkane, pyrazoline, pyrazolone, phenylanediamine, arylamine, amino-substituted calcone, styryl anthracene, fluorenone, hydrazone, stilbene and silazane derivatives; aromatic tertiary amine, styrylamine, aromatic dimethylidene and porphyrin compounds; anthraquinodimethane, anthrone, diphenylquinone, thiopyrandioxide, carbodiimide, fluoreniridenemethane and distyrylpyrazine derivatives; hetrocyclic tetracarboxylic anhydrides such as naphthaleneperylene; phthalocyanine derivatives; metal complexes of 8-quinolinol derivatives, various metal complex polysilane compounds represented by metal complexes having metalphthalocyanine, benzoxazole or benzothiaole as a ligand; electroconductive polymer oligomers such as poly (N-vinylcarbazole) derivatives, aniline copolymers, thiophene oligomers and polythiophene; and polymer compounds such as polythiophene, polyphenylene, polyphenylenevinylene and polyfluorene derivatives. Host compounds can be used individually or as a combination of two or more kinds.

Examples of the carbazole derivatives among the host compounds suitable for phosphorescence emission include compounds represented by the structural formulas below.

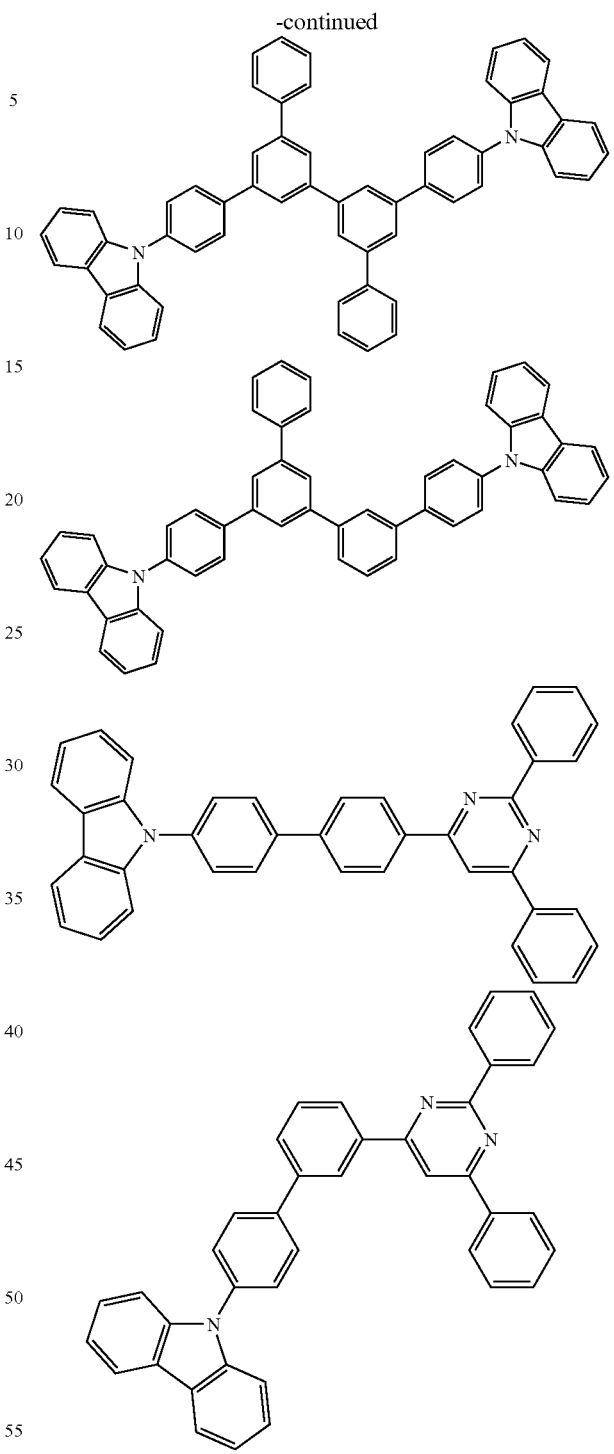

A phosphorescent dopant is a compound that can emit light from triplet excitons. The dopant is not limited as long as it can emit light from triplet excitons, but it is preferably a metal complex containing at least one metal selected from the group of Ir, Ru, Pd, Pt, Os and Re. A porphyrin metal complex or an ortho-metalated metal complex is preferable. As a porphyrin metal complex, a porphyrin platinum complex is preferable. The phosphorescent compounds can be used individually or as a combination of two or more kinds.

There are various ligands forming an ortho-metalated metal complex. Preferable ligands include 2-phenylpyridine, 7,8-benzoquinoline, 2-(2-thienyl)pyridine, 2-(1-naphtyl)pyridine and 2-phenylquinoline derivatives. These derivatives can contain substituents if necessary. Fluorides and derivatives containing a trifluoromethyl group are particularly preferable as a blue dopant. As an auxiliary ligand, preferred are ligands other than the above-mentioned ligands, such as acetylacetonate and picric acid may be contained.

The content of a phosphorescent dopant in an emitting layer is not limited and can be properly selected according to purposes; for example, it is 0.1 to 70 mass %, preferably 1 to 30 mass %. When the content of a phosphorescent compound is less than 0.1 mass %, emission may be weak and the advantages thereof may not be sufficiently obtained. When the content exceeds 70 mass %, the phenomenon called concentration quenching may significantly proceed, thereby degrading the device performance.

An emitting layer may contain a hole-transporting material, electron-transporting material or polymer binder if necessary.

The thickness of a blue emitting layer is preferably from 5 to 50 nm, more preferably from 7 to 50 nm and most preferably from 10 to 50 nm. When it is less than 5 nm, the formation of an emitting layer and the adjustment of chromaticity may become difficult. When it exceeds 50 nm, the driving voltage may increase.

(2) Yellow-to-Red Emitting Layer

In the invention, any one of two emitting layers between which an electron barrier is interposed may be a yellow-to-red emitting layer, but the cathode-side emitting layer is preferably a yellow-to-red emitting layer.

The yellow-to-red emitting layer is preferably a layer which emits light with a maximum wavelength of 540 to 700 nm, and more preferably 550 to 650 nm; and preferably made of a host material and a yellow-to-red dopant. Examples of the host material are preferably styryl derivatives, anthracene derivatives, aromatic amines, and metal complexes of 8-hydroxyquinoline or its derivatives. As an example of the styryl derivatives, anthracene derivatives and aromatic amines, host materials used for a blue emitting layer can also be used for a yellow-to-red emitting layer. As an example of the metal complexes of 8-hydroxyquinoline or its derivatives, metal chelate oxynoide compounds including chelates of oxine (generally 8-quinolinol or 8-hydroxyquinoline), such as tris (8-quinolinol) aluminum, can be used. When a compound with a high electron-transporting property such as anthracene derivatives is used as a host material, host materials for a blue emitting layer and a yellow-to-red emitting layer may be the same or different.

There can be used as a yellow-to-red dopant florescent compounds containing at least one of a fluoranthene skeleton and a perylene skeleton. Examples include compounds represented by the following general formulas [12] to [28].

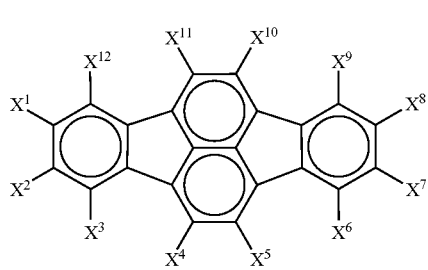

[12]

-continued

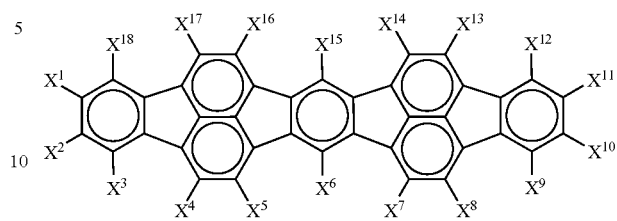

[13]

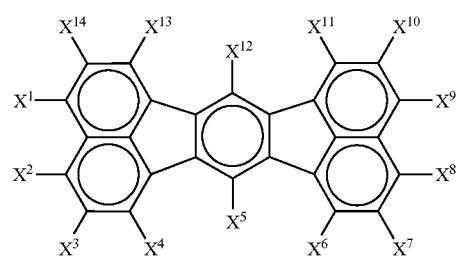

[14]

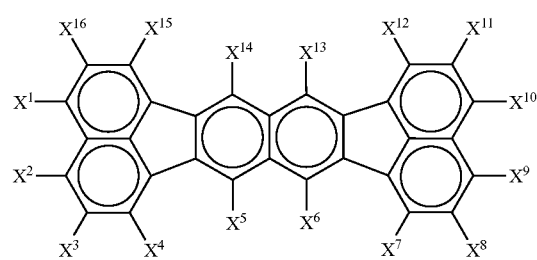

[15]

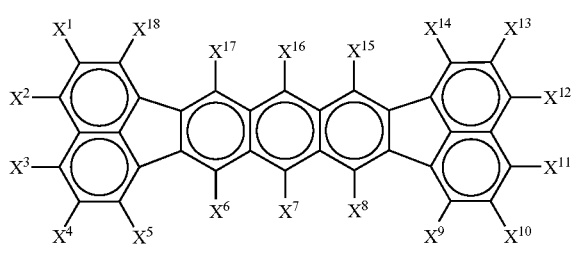

[16]

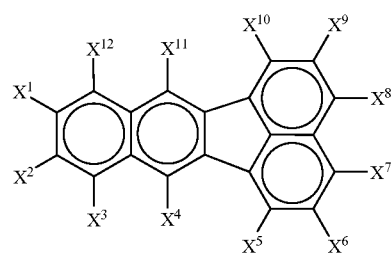

[17]

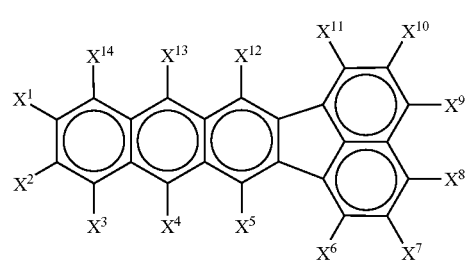

[18]

-continued

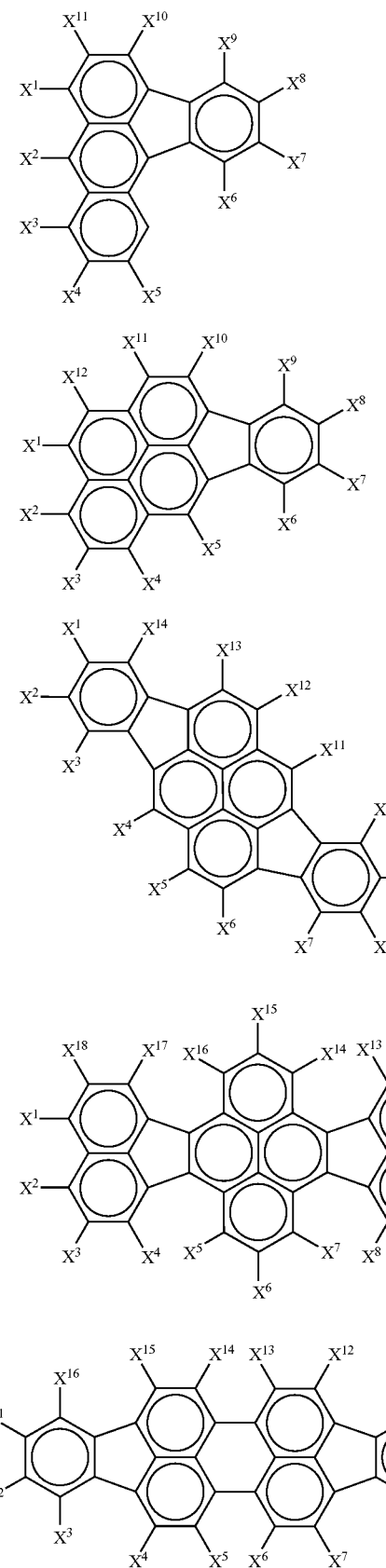

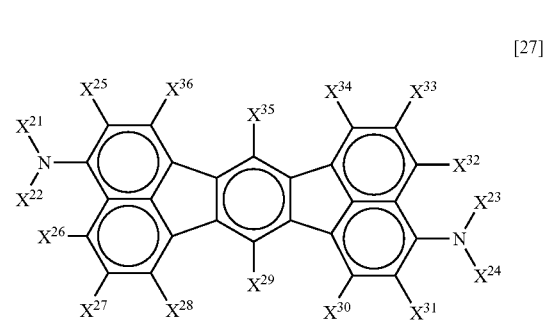

wherein $X^1$ to $X^{20}$ are independently a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^1$ to $X^{20}$ may be bonded together to form a ring structure; and when adjacent substituents are an aryl group, the substituents may be the same.

The compounds represented by the general formulas [12] to [26] preferably contain an amino group or an alkenyl group.

-continued

[28]

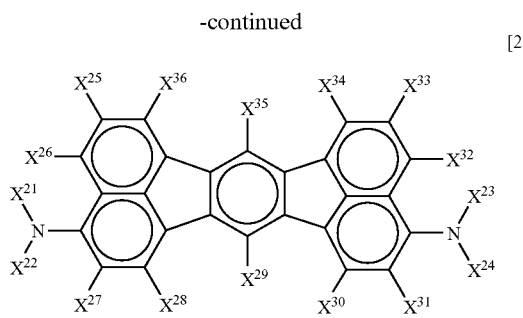

wherein $X^{21}$ to $X^{24}$ are independently an alkyl group with 1 to 20 carbon atoms, a substituted or unsubstituted aryl group with 6 to 30 carbon atoms; $X^{21}$ and $X^{22}$ and/or $X^{23}$ and $X^{24}$ may be bonded to each other with a carbon to carbon bond, —O— or —S— therebetween; $X^{25}$ to $X^{36}$ are a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^{25}$ to $X^{36}$ may be bonded together to form a ring structure; and the substituents $X^{25}$ to $X^{36}$ in each of the formulas preferably contain an amine or alkenyl group.

A florescent compound containing a fluoranthene skeleton preferably contains an electron-donating group for high performance and long lifetime. A preferable electron-donating group is a substituted or unsubstituted arylamino group. The fluorescent compound containing a fluoranthene skeleton preferably has 5 or more fused rings, more preferably 6 or more fused rings. The fluorescent compound has a fluorescent peak wavelength of 540 to 700 nm. The emission from a blue light emitting material and emission from the fluorescent compound overlap to give a white color. The above-mentioned fluorescent compound preferably contains a plurality of fluoranthene skeletons since the emitted light falls in the yellow-to-orange or red zone. Particularly preferred fluorescent compound contains an electron-donating group and a fluoranthene or perylene skeleton and has a fluorescent peak wavelength of 540 to 700 nm.

For a yellow-to-red emitting layer, a phosphorescent compound can be used. A preferred phosphorescent compound is a compound that is a host material containing a carbazole ring and the compounds used for a blue emitting layer can be used. A dopant is a compound that can emit from triplet excitons. The dopant is not limited as long as it can emit from triplet excitons but it is preferably a metal complex containing at least one metal selected from the group of Ir, Ru, Pd, Pt, Os and Re. A porphyrin metal complex or an ortho-metalated metal complex is preferable. There are various ligands forming an ortho-metalated metal complex. Preferable ligands include 2-phenylpyridine, 7,8-benoquinoline, 2-(1-naphtyl) pyridine and 2-phenylquinoline derivatives. These derivatives can contain substituents if necessary. Preferred are 2-phenylquinoline derivatives, 2-(2-thienyl)pyridine derivatives and the like as a yellow-to-red dopant. Ligands other than the above-mentioned ligands, such as acetylacetonate and picric acid, may be contained as an auxiliary ligand.

The content of a phosphorescent dopant in an emitting layer is not limited and can be properly selected according to purposes; for example, it is 0.1 to 70 mass %, preferably 1 to 30 mass %. When the content of a phosphorescent compound is less than 0.1 mass %, emission may be weak and the advantages thereof may not be sufficiently obtained. When the content exceeds 70 mass %, the phenomenon called concentration quenching may significantly proceed, thereby degrading the device performance.

The thickness of a yellow-to-red emitting layer is generally 5 nm or more, preferably from 10 to 50 nm, more preferably from 20 to 50 nm and most preferably from 30 to 50 nm. When it is less than 5 nm, the luminous efficiency may decrease. When it exceeds 50 nm, the driving voltage may increase.

(3) Electron-Transporting Emitting Material

In the invention, the two emitting layers arranged with an electron barrier layer interposed therebetween are each made of an electron-transporting material. Therefore, in the invention, emitting materials used for the blue emitting layer and the yellow-to-red emitting layer are electron-transporting emitting materials. The electron-transporting emitting materials are preferably emitting materials having an electron mobility of $10^{-6}$ cm$^2$/Vs or more. Specifically, metal complexes of anthracene derivatives, 8-hydroxyquinoline or its derivatives, and the like may be used. The electron mobility and the hole mobility can be measured by the Time of Flight method or the like.

The measurement of electron mobility by the Time of Flight method can be conducted with TOF-301 manufactured by Kabushiki Kaisha Optel or the like.

2. Electron Barrier Layer

The electron barrier layer is preferably made of a compound having an affinity level smaller than that of the cathode-side emitting layer. In this case, the compound is not particularly limited so long as one having an affinity level smaller than that of the cathode-side emitting layer, and various kinds of organic compounds or inorganic compounds may be employed. Materials used for the electron barrier layer preferably have an affinity level of at least 0.2 eV less than that of the material of the cathode-side emitting layer. For example, the material for forming the electron barrier layer can be arbitrarily selected from materials which have been widely used as a material transporting electric charge of holes in photoconductive materials and known materials used in a hole-injecting layer/hole-transporting layer of organic EL devices, such as tertiary amine compounds, and the like can be employed. The thickness of the electron barrier layer is preferably 1 to 30 nm, more preferably 1 to 20 nm.

The affinity level (hereinafter referred to as Af) can be obtained by the following equation from the ionization potential value (hereinafter referred to as Ip) using AC-1 manufactured by Riken Keiki Co., Ltd. and the optical band gap (hereinafter referred to as Eg) calculated from the ultraviolet to visible absorption spectrum.

$$Af=Ip-Eg$$

The difference ΔIp in the ionization potential between the electron barrier layer and the emitting layer (anode-side emitting layer or cathode-side emitting layer) adjacent to the electron barrier layer is preferably 0.2 eV or less. When the difference of the ionization potential, ΔIp is more than 0.2 eV, only one of the two emitting layers may emit or the driving voltage may increase significantly, it being undesirable. By bringing the ionization potential of the electron barrier layer near to that of the emitting layer, the high efficiency can be attained.

In the above, the explanation is given to the case in that two emitting layers are arranged with an electron barrier layer interposed therebetween, and one of the two emitting layers is made to a blue emitting layer and another is made to a yellow-to-red emitting layer, to obtain white light emission. However, the invention is not limited to the above-explained constitution. For example, as explained above, three emitting layers may be provided, and electron barrier layers may be arranged each between the emitting layers to make the three emitting layers to a blue, red and green emitting layers and to cause the emissions at the respective interfaces. Thus, a white organic EL device may be constituted.

2. Other Organic Layers (1) First Organic Layer

A hole-injecting layer, a hole-transporting layer, an organic semiconductor layer and the like can be arranged between the anode and the anode-side emitting layer as a first organic layer. The hole-injecting layer or the hole-transporting layer is a layer for helping the injection of holes into the emitting layer so as to transport holes to an emitting region. The hole mobility thereof is large and the ionization energy thereof is usually as small as 5.5 eV or less. A hole-injecting layer is formed to control energy level, for example, to reduce rapid energy level changes. Such a hole-injecting layer or hole-transporting layer is preferably made of a material which can transport holes to the emitting layer at low electric field intensity. The hole mobility thereof is preferably at least $10^{-6}$ $cm^2/V \cdot second$ when an electric field of, e.g., $10^4$ to $10^6$ V/cm is applied. The material for forming the hole-injecting layer or the hole-transporting layer can be arbitrarily selected from materials which have been widely used as a material transporting electric charge of holes in photoconductive materials and known materials used in a hole-injecting layer of organic EL devices.

As materials for forming a hole-injecting layer and a hole-transporting layer, specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820, 989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stylbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

The above-mentioned substances can be used as the material of the hole-injecting layer or the hole-transporting layer. The following can also be used: porphyrin compounds (disclosed in JP-A-63-2956965 and others), aromatic tertiary amine compounds, styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), and the aromatic tertiary amine compounds. The following can also be given as examples: 4,4'-bis(N-(1-naphthyl)-N-phenylamino)biphenyl, which has in the molecule thereof two condensed aromatic rings, disclosed in U.S. Pat. No. 5,061,569, and 4,4',4"-tris(N-(3-methylphenyl)-N-phenylamino)triphenylamine, wherein three triphenylamine units are linked to each other in a star-burst form, disclosed in JP-A-4-308688. Inorganic compounds such as aromatic dimethylidene type compounds, mentioned above as the material for an emitting layer, and p-type Si and p-type SiC can also be used as the material of the hole-injecting layer or the hole-transporting layer.

This hole-injecting layer or the hole-transporting layer may be a single layer made of one or more of the above-mentioned materials. Hole-injecting layers or the hole-transporting layers made of compounds different from each other may be stacked. The thickness of the hole-injecting layer or the hole-transporting layer is not particularly limited, and is preferably from 20 to 200 nm.

The organic semiconductor layer is a layer for helping the injection of holes or electrons into the emitting layer, and is preferably a layer having an electroconductivity of $10^{-10}$ S/cm or more. The material of such an organic semiconductor layer may be an electroconductive oligomer, such as thiophene-containing oligomers or arylamine-containing oligomers disclosed in JP-A-8-193191, electroconductive dendrimers such as arylamine-containing dendrimers. The thickness of the organic semiconductor layer is not particularly limited, and is preferably from 10 to 1,000 nm.

(2) Second Organic Layer

An electron-injecting layer, an electron-transporting layer and the like can be arranged between a cathode and a cathode-side emitting layer as a second organic layer. The electron-injecting layer or the electron-transporting layer is a layer for helping the injection of electrons into the emitting layer, and has a large electron mobility. The electron-injecting layer is formed to control energy level, for example, to reduce rapid energy level changes.

The thickness of the electron-transporting layer is optionally selected several nanometers to several micrometers. However, the thickness is preferably selected such that when an electric field of $10^4$ to $10^6$ V/cm is applied, the electron mobility becomes $10^{-5}$ $cm^2/Vs$ or more. The electron mobility can be measured by the same method as the hole mobility measurement.

The material used in the electron-injecting layer or the electron-transporting layer is preferably a metal complex of 8-hydroxyquinoline or a derivative thereof.

Specific examples of the metal complex of 8-hydroxyquinoline or 8-hydroxyquinoline derivative include metal chelate oxynoid compounds containing a chelate of oxine (generally, 8-quinolinol or 8-hydroxyquinoline). For example, tris (8-quinolinol) aluminum (Alq) described in the explanation of the emitting materials can be used.

Examples of the oxadiazole derivative include electron-transporting compounds represented by the following general formulas:

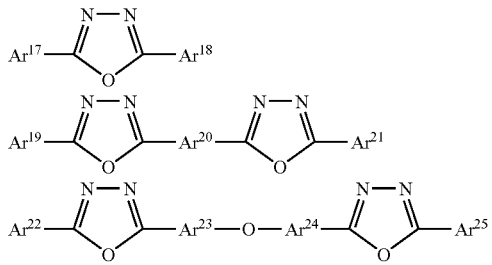

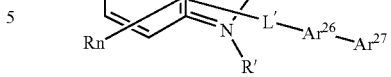

wherein $Ar^{17}$, $Ar^{18}$, $Ar^{19}$, $Ar^{21}$, $Ar^{22}$ and $Ar^{25}$ are the same or different and each represent a substituted or unsubstituted aryl group; $Ar^{20}$, $Ar^{23}$ and $Ar^{24}$ are the same or different and each represent a substituted or unsubstituted arylene group.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituent include alkyl groups with 1 to 10 carbons, alkoxy groups with 1 to 10 carbons, and a cyano group. The electron-transporting compounds are preferably ones from which a thin film can be easily formed.

Specific examples of the electron-transporting compounds are as follows.

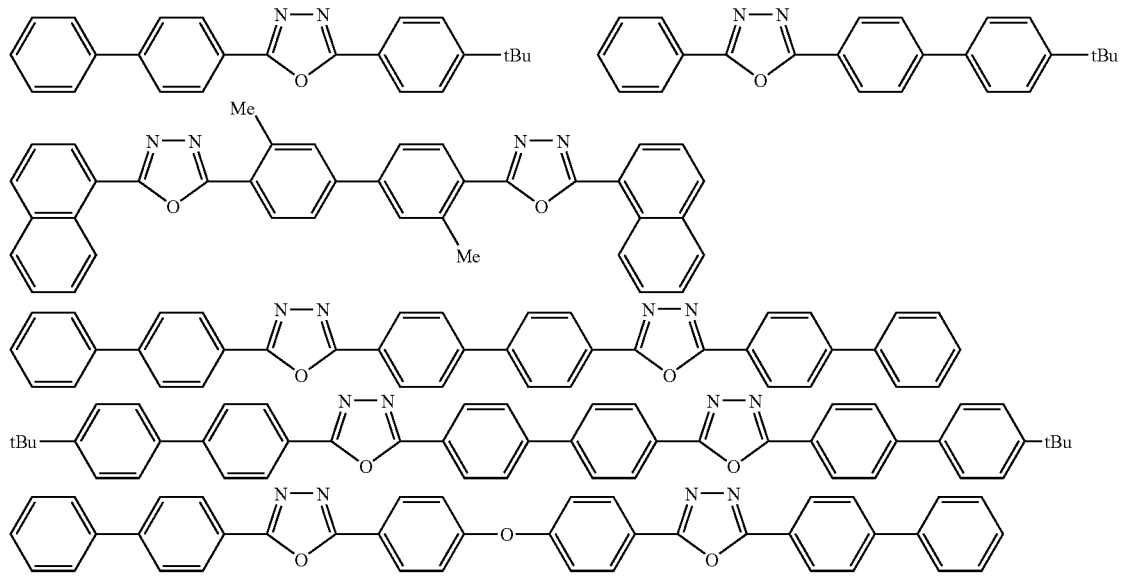

Nitrogen-containing cyclic compounds shown below

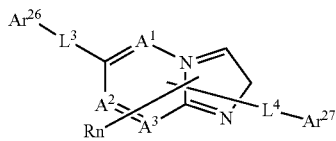

-continued wherein $A^1$ to $A^3$ is a nitrogen atom or carbon atom; R and R' each represent a substituted or unsubstituted aryl group with 6 to 60 carbon atoms, a substituted or unsubstituted heteroaryl group with 3 to 60 carbon atoms, an alkyl group with 1 to 20 carbon atoms, a haloalkyl group with 1 to 20 carbon atoms, or an alkoxy group with 1 to 20 carbon atoms; n is an integer of 0 to 5 and when n is an integer of 2 or more, Rs may be the same or different.

Adjacent Rs may be bonded to each other to form a substituted or unsubstituted carbocyclic aliphatic ring or a substituted or unsubstituted carbocyclic aromatic ring.

$Ar^{26}$ is a substituted or unsubstituted aryl group with 6 to 60 carbon atoms, or a substituted or unsubstituted heteroaryl group with 3 to 60 carbon atoms.

$Ar^{26'}$ is a substituted or unsubstituted arylene group with 6 to 60 carbon atoms, or a substituted or unsubstituted heteroarylene group with 3 to 60 carbon atoms.

$Ar^{27}$ is a hydrogen atom, an alkyl group with 1 to 20 carbon atoms, a haloalkyl group with 1 to 20 carbon atoms, an alkoxy group with 1 to 20 carbon atoms, a substituted or unsubstituted aryl group with 6 to 60 carbon atoms, or a substituted or unsubstituted heteroaryl group with 3 to 60 carbon atoms.

Provided that either $Ar^{26}$ or $Ar^{27}$ is a substituted or unsubstituted condensed cyclic group with 10 to 60 carbon atoms or a substituted or unsubstituted condensed heterocyclic group with 3 to 60 carbon atoms.

$L^3$, $L^4$ and $L'$ each represent a single bond, a substituted or unsubstituted condensed cyclic group with 6 to 60 carbon atoms, a substituted or unsubstituted condensed heterocyclic group with 3 to 60 carbon atoms, or a substituted or unsubstituted fluorenylene group.

Nitrogen-containing cyclic compounds shown below

wherein HAr is a substituted or unsubstituted nitrogen-containing heterocyclic ring with 3 to 40 carbon atoms, $L^5$ is a single bond, a substituted or unsubstituted arylene group with 6 to 60 carbon atoms, a substituted or unsubstituted heteroarylene group with 3 to 60 carbon atoms, or a substituted or unsubstituted fluorenylene group.

$Ar^{28}$ is a substituted or unsubstituted bivalent aromatic hydrocarbon group with 6 to 60 carbon atoms.

$Ar^{29}$ is a substituted or unsubstituted aryl group with 6 to 60 carbon atoms or a substituted or unsubstituted heteroaryl group with 3 to 60 carbon atoms.

Silacyclopentadiene derivatives represented by the following formula, disclosed in JP-A-09-087616

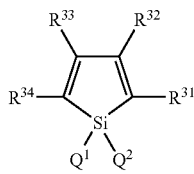

wherein $Q^1$ and $Q^2$ are each a saturated or unsaturated hydrocarbon group with 1 to 6 carbon atoms, an alkoxy group, an alkenyloxy group, an alkynyloxy group, a hydroxyl group, a substituted or unsubstituted aryl group, or a substituted or unsubstituted heterocyclic group, or $Q^1$ or $Q^2$ are bonded to each other to form a saturated or unsaturated ring; $R^{31}$ to $R^{34}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or a structure formed by condensing adjacent substituted or unsubstituted rings.

Silacyclopentadiene derivative represented by the following formula, disclosed in JP-A-09-194487

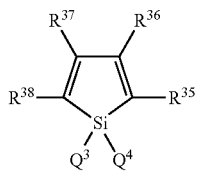

wherein $Q^3$ and $Q^4$ each represent a saturated or unsaturated hydrocarbon group with 1 to 6 carbon atoms, an alkoxy group, an alkenyloxy group, an alkynyloxy group, a substituted or unsubstituted aryl group, or a substituted or unsubstituted heterocyclic group, or $Q^3$ or $Q^4$ are bonded to each other to form a saturated or unsaturated ring; $R^{35}$ to $R^{38}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group, a cyano group, or a substituted or unsubstituted condensed ring structure formed by adjacent substituents of $R^{35}$ to $R^{38}$: however, in the case where $R^{35}$ and $R^{38}$ are a phenyl group, $Q^3$ and $Q^4$ are neither an alkyl group nor a phenyl group; in the case where $R^{35}$ and $R^{38}$ are a thienyl group, $Q^3$, $Q^4$, $R^{36}$ and $R^{37}$ do not form the structure where $Q^3$ and $Q^4$ are a monovalent hydrocarbon group, and at the same time $R^{36}$ and $R^{37}$ are an alkyl group, an aryl group, an alkenyl, or an aliphatic group with a ring formed by $R^{36}$ and $R^{37}$ bonded; in the case where $R^{35}$ and $R^{38}$ are a silyl group, $R^{36}$, $R^{37}$, $Q^3$ and $Q^4$ each represent neither a monovalent hydrocarbon group with 1 to 6 carbon atoms nor a hydrogen atom; and in the case where $R^{35}$ and $R^{36}$ are bonded to form a condensed structure with a benzene ring, $Q^3$ and $Q^4$ are neither an alkyl group nor a phenyl group.

Borane derivatives represented by the following formula, disclosed in JP-A1-2000-040586

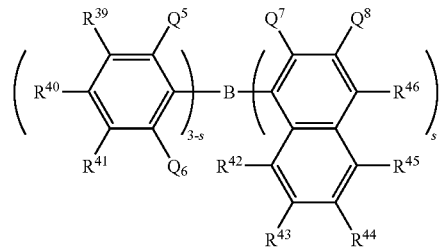

wherein $R^{39}$ to $R^{46}$ and $Q^8$ are each a hydrogen atom, a saturated or unsaturated hydrocarbon group, an aromatic group, a heterocyclic group, a substituted amino group, a substituted boryl group, an alkoxy group or an aryloxy group; $Q^5$, $Q^6$ and $Q^7$ each represent a saturated or unsaturated hydrocarbon group, an aromatic group, a heterocyclic group, a substituted amino group, an alkoxy group or an aryloxy group; the substituent of $Q^7$ and $Q^8$ may be bonded to each other to form condensed rings; s is an integer of 1 to 3, and $Q^7$s may be different from each other when s is 2 or more; provided that excluded are the compounds where s is 1, $Q^5$, $Q^6$ and $R^{40}$ each represent a methyl group and $R^{46}$ is a hydrogen atom or substituted boryl group, and the compounds where s is 3 and $Q^7$ is a methyl group.

Compounds represented by the following general formula, disclosed in JP-A-10-088121

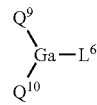

wherein $Q^9$ and $Q^{10}$ are independently a ligand represented by the following formula (I); and $L^6$ is a halogen atom, a substituted or unsubstituted alkyl group, a substituted or unsubstituted cycloalkyl group, a substituted or unsubstituted aryl group, a substituted or unsubstituted heterocyclic group, —$OR^{47}$ wherein $R^{47}$ is a hydrogen atom, a substituted or unsubstituted alkyl group, a substituted or unsubstituted cycloalkyl group, a substituted or unsubstituted aryl group, a substituted or unsubstituted heterocyclic group, or —O—Ga—$Q^{11}(Q^{12})$ wherein $Q^{11}$ and $Q^{12}$ are the same ligand as $Q^9$ and $Q^{10}$.

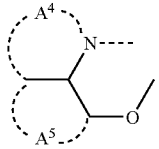

(3)

wherein rings $A^4$ and $A^5$ are a substituted or unsubstituted 6-membered aryl rings and are condensed to each other.

The metal complexes have the strong nature of an n-type semiconductor and large ability of injecting electrons. Further, the energy generated at the time of forming a complex is small, a metal is then strongly bonded to ligands in the complex formed and a fluorescent quantum efficiency is large.

Specific examples of the rings $A^4$ and $A^5$ which form the ligands of the above formula include halogen atoms such as chlorine, bromine, iodine and fluorine; substituted or unsubstituted alkyl groups such as methyl, ethyl, propyl, butyl, sec-butyl, tert-butyl, pentyl, hexyl, heptyl, octyl, stearyl and trichloromethyl; substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl; substituted or unsubstituted alkoxy groups such as methoxy, n-butoxy, tert-butoxy, trichloromethoxy, trifluoroethoxy, pentafluoropropoxy, 2,2,3,3-tetrafluoropropoxy, 1,1,1,3,3,3-hexafluoro-2-propoxy and 6-(perfluoroethyl)hexyloxy; substituted or unsubstituted aryloxy groups such as phenoxy, p-nitrophenoxy, p-tert-butylphenoxy, 3-fluorophenoxy, pentafluorophenyl and 3-trifluoromethylphenoxy; substituted or unsubstituted alkylthio groups such as methythio, ethylthio, tert-butylthio, hexylthio, octylthio and trifruoromethyltio; substituted or unsubstituted arylthio groups such as phenylthio, p-nitrophenylthio, p-tert-butylphenylthio, 3-fluorophenylthio, pentafluorophenylthio and 3-trifluoromethylphenylthio; a cyano group; a nitro group, an amino group; mono or di-substituted amino groups such as methylamino, dimethylamino, ethylamino, diethylamino, dipropylamino, dibutylamino and diphenylamino; acylamino groups such as bis(acetoxymethyl)amino, bis(acetoxyethyl)amino, bis(acetoxypropyl)amino and bis(acetoxybutyl)amino; a hydroxy group; a siloxy group; an acyl group; carbamoyl groups such as methylcarbamoyl, dimethylcarbamoyl, ethylcarbamoyl, diethylcarbamoyl, propylcarbamoyl, butylcarbamoyl and phenylcarbamoyl; a carboxylic group; a sulfonic acid group; an imido group; cycloalkyl groups such as cyclopentyl and cyclohexyl; aryl groups such as phenyl, naphthyl, biphenyl, anthranyl, phenanthryl, fluorenyl and pyrenyl; and heterocyclic groups such as pyridinyl, pyrazinyl, pyrimidinyl, pryidazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl. Moreover the above-mentioned substituents may be bonded to each other to form a six-membered aryl or heterocyclic ring.

A reducing dopant may be contained in an electron transporting region or an interface region between a cathode and an organic layer. The reducing dopant is defined as a substance which can reduce electron-transporting compounds. Various substances having certain reducibility can be used. The following can be preferably used: at least one substance selected from alkali metals, alkaline earth metals, rare earth metals, oxides of alkali metals, halides of alkali metals, oxides of alkaline earth metals, halides of alkaline earth metals, oxides of rare earth metals, halides of rare earth metals, organic complexes of alkali metals, organic complexes of alkaline earth metals and organic complexes of rare earth metals.

Preferable examples of the reducing dopant are at least one alkali metal selected from Na (work function: 2.36 eV), K (work function: 2.28 eV), Rb (work function: 2.16 eV) and Cs (work function: 1.95 eV) or at least one alkaline earth metal selected from Ca (work function: 2.9 eV), Sr (work function: 2.0 to 2.5 eV) and Ba (work function: 2.52 eV). Particularly preferred are ones having a work function of 2.9 eV or less. Among these, a more preferable reducing dopant is at least one alkali metal selected from K, Rb and Cs, even more preferably Rb and Cs and the most preferably Cs. These alkali metals have a particularly high reducing ability, and therefore adding a relatively small amount thereof into an electron injecting region enhances the luminance and lifetime of the organic EL device. As a reducing dopant having a work function of 2.9 eV or less, combinations of two or more of these alkali metals are preferable. Combinations with Cs, for example, Cs and Na, Cs and K, Cs and Rb or Cs, Na and K are particularly preferable. The combination with Cs efficiently exhibits a reducing ability and the addition thereof into an electron injecting region enhances the luminance and the lifetime of the organic EL device.

In the invention, an electron-injecting layer formed of an insulator or a semiconductor may further be provided between a cathode and an organic layer. By providing the layers, current leakage can be effectively prevented to improve the injection of electrons. As the insulator, at least one metal compound selected from alkali metal calcogenides, alkaline earth metal calcogenides, halides of alkali metals and halides of alkaline earth metals can be preferably used. By forming an electron-injecting layer from these compounds, the injection of electrons can be preferably improved. Specifically preferable alkali metal calcogenides include $Li_2O$, LiO, $Na_2S$, $Na_2Se$ and NaO and preferable alkaline earth metal calcogenides include CaO, BaO, SrO, BeO, BaS and CaSe. Preferable halides of alkali metals include LiF, NaF, KF, LiCl, KCl and NaCl. Preferable halides of alkaline earth metals include fluorides such as $CaF_2$, $BaF_2$, $SrF_2$, $MgF_2$ and $BeF_2$ and halides other than fluorides.

Examples of the semiconductor include oxides, nitrides or oxynitrides containing at least one element selected from Ba, Ca, Sr, Yb, Al, Ga, In, Li, Na, Cd, Mg, Si, Ta, Sb and Zn, and combinations of two or more thereof. The inorganic compound of which the electron-transporting layer is made is preferably a microcrystalline or amorphous insulating thin film. By the constitution that an electron-transporting layer is formed of the insulating thin film, a more uniform thin film can be formed to reduce pixel defects such as dark spots. Such inorganic compounds include alkali metal calcogenides, alkaline earth metal calcogenides, halides of alkali metals and halides of alkaline earth metal as explained above.

The thickness of the electron-injecting layer or the electron-transporting layer is not particularly limited, but is preferably 1 to 100 nm.

The blue emitting layer or the first organic layer preferably contains an oxidant. Preferable oxidants are electron attractors or electron acceptors. Examples thereof include Lewis acids, various quinone derivatives, dicyanoquinodimethane derivatives, and salts of aromatic amines and Lewis acids. Particularly preferred Lewis acids include iron chloride, antimony chloride and aluminum chloride.

The yellow-to-red emitting layer or the second organic layer preferably contains a reducing agent. Preferable reducing agents are alkali metals, alkaline earth metals, oxides of alkali metals, oxides of alkaline earth metals, oxides of rare earth metals, halides of alkali metals, halides of alkaline earth metals, halides of rare earth metals, and complexes formed of alkali metals and aromatic compounds. Particularly preferred alkali metals are Cs, Li, Na and K.

3. Inorganic Compound Layer

There may be provided an inorganic compound layer(s) in contact with an anode and/or a cathode. The inorganic compound layer functions as an adhesion improving layer. Preferable inorganic compounds used for the inorganic compound layer include alkali metal oxides, alkaline earth metal oxides, rare earth metal oxides, alkali metal halides, alkaline earth metal halides, rare earth metal halides, and various oxides, nitrides and nitric oxides such as $SiO_x$, $AlO_x$, $SiN_x$, SiON, AlON, $GeO_x$, $LiO_x$, LiON, $TiO_x$, TiON, $TaO_x$, TaON, $TaN_x$, and C. As components of layer in contact with an anode, $SiO_x$, $AlO_x$, $SiN_x$, SiON, AlON, $GeO_x$ and C are preferable, since they can form a stable injecting interface layer. As components of layer in contact with a cathode, LiF, $MgF_2$, $CaF_2$, $MgF_2$ and NaF are preferable. The thickness of the inorganic compound layer is not particularly limited, and is preferably from 0.1 nm to 100 nm.

Methods of forming various organic layers including an emitting layer and inorganic compound layer are not particularly limited. For example, known methods such as deposition, spin coating, casting, and LB technique can be applied. The electron-injecting layer and emitting layer are preferably formed by the same method, because this makes the properties of the organic EL devices obtained constant and the production time can be shortened. For example, when the electron-injecting layer is formed by deposition, the emitting layer also is preferably formed by deposition.

4. Electrodes

For the anode, the following is preferably used: metals, alloys or electric conductive compounds, or mixtures thereof that have a large work function (e.g., 4.0 eV or more). Specific examples are indium tin oxide (ITO), indium zinc oxide, tin, zinc oxide, gold, platinum, and palladium. They can be used individually or as a combination of 2 or more kinds. The thickness of the anode is not particularly limited, but preferably ranges 10 to 1,000 nm, more preferably 10 to 200 nm.

For the cathode, the following is preferably used: metals, alloys or electric conductive compounds, or a mixture thereof that has a small work function (e.g., less than 4.0 eV). Specific examples include magnesium, aluminum, indium, lithium, sodium, and silver. They can be used individually or as a combination of 2 or more kinds. The thickness of the cathode is not also particularly limited, but preferably ranges 10 to 1,000 nm, more preferably 10 to 200 nm.

It is preferred that at least one of the anode and the cathode be substantially translucent, more specifically, have a light transmission of 10% or more, in order to effectively take out light emitted from an emitting layer to the outside. The electrodes can be formed by vacuum deposition, sputtering, ion plating, electron beam deposition, CVD, MOCVD, plasma CVD and so on.

EXAMPLES

Examples of the invention are described as follows. The invention is not limited to these examples.

Organic EL devices fabricated by the examples are evaluated as follows.

(1) Initial Performance: Evaluated by measuring. chromaticity in CIE1931 chromaticity coordinates.

(2) Ionization Potential (hereinafter referred to as. "IP"): Measured with AC-1 (RIKEN KEIKI CO.,LTD.)

(3) Affinity Level (hereinafter referred to as "Af"): Af=IP−Eg (Eg indicates an optical bandgap calculated from an ultra-violet-visible absorption spectrum.)

(4) Luminous Efficiency: A certain voltage was applied to a device and luminance was measured with CS-1000, a luminance meter manufactured by MINOLTA Co.,LTD. At the same time, a current value was measured with an ampere meter made by Keithley Instrument Inc. Luminous efficiency was calculated from the results.

(Fabrication of an Organic EL Device)

A glass substrate, 25 mm×75 mm×1.1 mm thick, having an ITO transparent electrode (manufactured by Geomatics Co.) was subjected to ultrasonic cleaning in isopropyl alcohol for 5 minutes followed by UV ozone cleaning for 30 minutes. The cleaned glass substrate having transparent electrode lines was set up on a substrate holder in a vacuum deposition device. First, a N,N'-bis(N,N'-diphenyl-4-aminophenyl)-N,N-diphenyl-4,4'-diamino-1,1'-biphenyl film (TPD232 film, represented by the following formula) was formed in a thickness of 60 nm on the surface on which the transparent electrode lines were formed, so as to cover the transparent electrode. This film functioned as a hole-transporting layer. After forming the TPD232 film, a 4,4'-bis[N-(1-naphtyl)-N-phenylamino] biphenyl film (NPD film hereinafter, represented by the following formula) was formed in a thickness of 20 nm thereon. This NPD film functioned as a hole-transporting layer.

[TPD232]

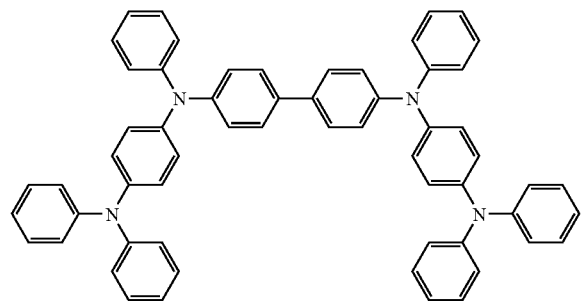

[NPD]

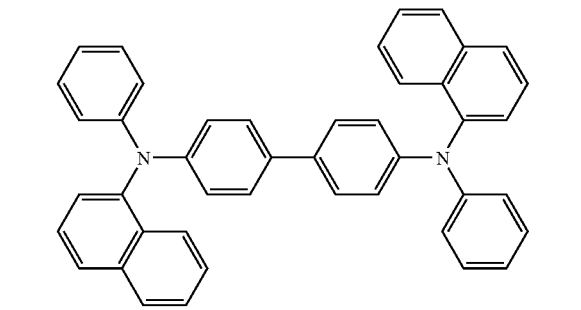

Following the NPD film formation, an anthracene derivative represented by the following formula [32] and a fluoranthene derivative represented by the following formula [34] (R1; yellow-to-red dopant; fluorescent peak wavelength of 545 nm) were deposited in a thickness of 10 nm at a weight ratio of 40:2 to form a yellow-to-red emitting layer (anode-side emitting layer; IP/Af(eV)=5.7/2.7). Next, a 5 nm thick NPD film was formed to function as an electron barrier layer (IP/Af(eV)=5.2/2.2). The anthracene derivative represented by the following formula [32] and a styryl derivative (B1, blue series dopant) represented by the following formula [33] were deposited in a thickness of 30 nm at a weight ratio of 40:2 to form a blue emitting layer (anode-side emitting layer (Ip/Af (eV)=5.7/2.7)). Next, on this film, a tris(8-quinolinol)aluminum film (Alq film, represented by the following formula) was formed in a thickness of 10 nm as an electron-transporting layer. Thereafter, Li (Li source, manufactured by Saes getter Co.) and Alq were co-deposited in a thickness of 10 nm to form an Alq:Li film, an electron-injecting layer. Metal Al was deposited in a thickness of 150 nm on this Alq:Li film to form a metal cathode, thereby fabricating an organic EL emitting layer.

[32]

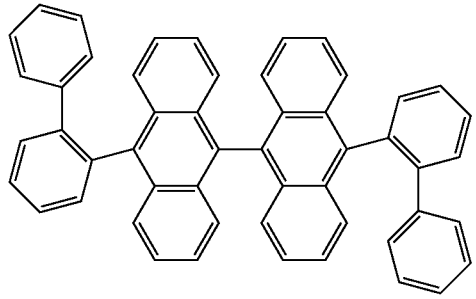

[33]

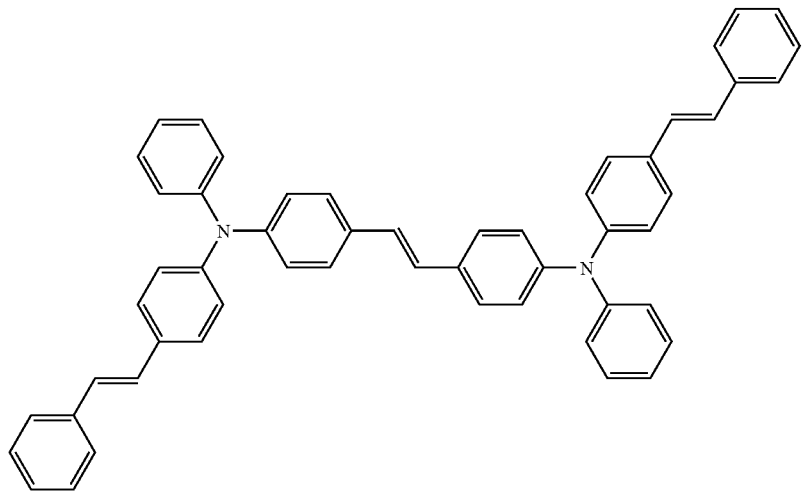

[34]

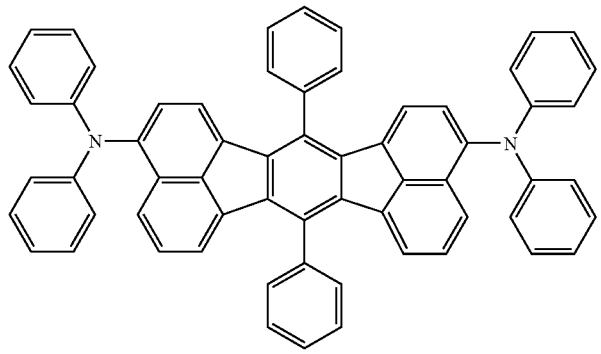

[Alq]

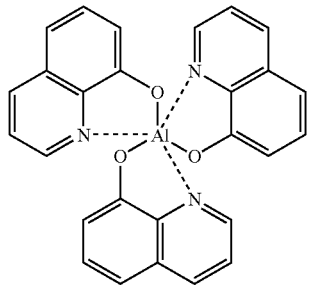

Figure 3:
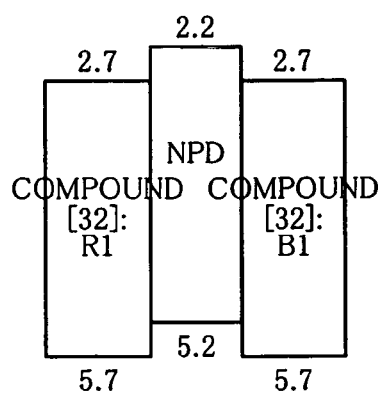
FIGS. 3(a), (b), (c), (d), (e) and (f) are diagrams representing energy levels of the organic EL devices fabricated in Examples 1 to 4 and Comparative Examples 1 and 2, respectively.
Figure 3:
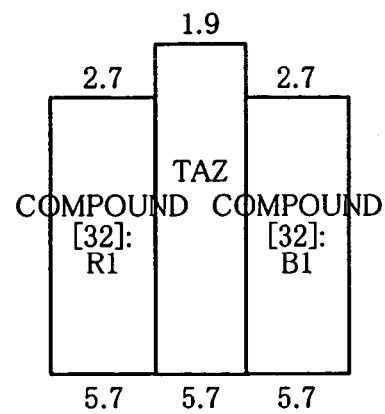
Figure 3:
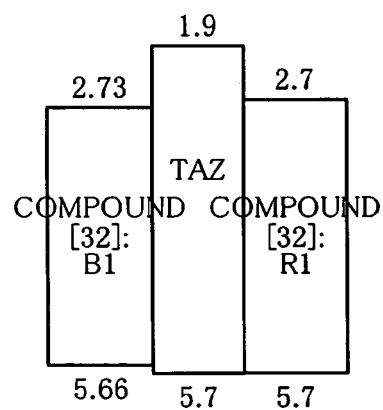
Figure 3:
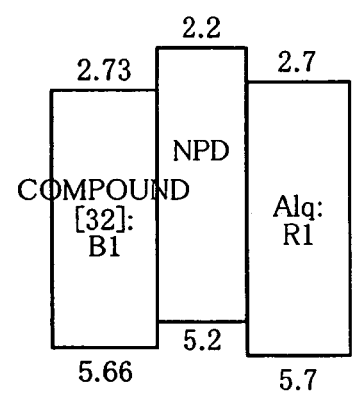
Figure 3:
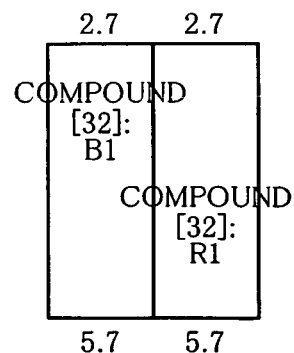
Figure 3:
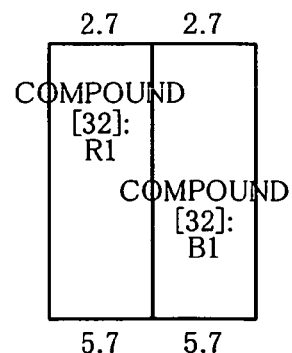

Table 1 shows the CIE1931 chromaticity coordinates (x, y), emission color, luminous efficiency at an emitting luminance of 100 cd/m², difference ΔAf in affinity level between the electron barrier layer and the cathode-side emitting layer, and difference ΔIP in ionization potential between the anode-side and cathode-side emitting layers of the devices obtained. FIG. 3(a) shows the energy level of the electron barrier layer and layers on both sides thereof.

Example 2

An organic EL device was fabricated in the same way as in Example 1 except that a triazole derivative (TAZ, represented by the following formula) film was formed in a thickness of 5 nm as an electron barrier layer instead of NPD. Like in Example 1, for the device obtained, Table 1 shows the emission color, the luminous efficiency and so on and FIG. 3(b) shows the energy level of the electron barrier layer and layers on both sides thereof.

[TAZ]

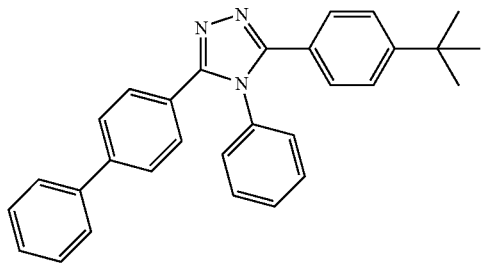

Example 3

A device was fabricated in the same way as in Example 1 except for the following. After the formation of the NPD film which functioned as a hole-transporting layer, the anthracene derivative represented by the above formula [32] and B1 represented by the above formula [33] were deposited in a thickness of 30 nm at a weight ratio of 40:2 to form a blue emitting layer. Next, a TAZ film was formed in a thickness of 5 nm. Thereafter, the anthracene derivative represented by the above formula [32] and R1 (fluorescent peak wavelength: 545 nm) represented by formula [34] were deposited in a thickness of 10 nm at a weight ratio of 40:2 to form a yellow-to-red emitting layer. Like in Example 1, for the device obtained, Table 1 shows emission color, luminous efficiency and so on and FIG. 3(c) shows the energy level of the electron barrier layer and layers on both sides thereof.

Example 4

An organic EL device was fabricated in the same way as in Example 1 except for the following. After the formation of the NPD film which functioned as a hole-transporting layer, the anthracene derivative represented by the above formula [32] and B1 represented by the above formula [33] were deposited in a thickness of 30 nm at a weight ratio of 40:2 to form a blue emitting layer. Next, a NPD film was formed in a thickness of 5 nm. Thereafter, Alq and R1 (fluorescent peak wavelength: 545 nm) represented by formula [34] were deposited in a thickness of 10 nm at a weight ratio of 40:2 to form a yellow-to-red emitting layer. Like in Example 1, for the device obtained, Table 1 shows emission color, luminous efficiency and so on and FIG. 3(d) shows the energy level of the electron barrier layer and layers on both sides thereof.

Comparative Example 1

An organic EL device was fabricated in the same way as in Example 1 except that an electron barrier layer was not formed between an anode-side emitting layer (a yellow-to-red emitting layer) and a cathode-side emitting layer (a blue emitting layer). The chromaticity of the device was (0.50, 0.42). White emission was not obtained but yellow emission was observed. Like in Example 1, for the device obtained, Table 1 shows emission color, luminous efficiency and so on and FIG. 3(e) shows the energy level of the electron barrier layer and layers on both sides thereof.

Comparative Example 2

An organic EL device was fabricated in the same way as in Example 3 except that an electron barrier layer was not formed between an anode-side emitting layer (a blue emitting layer) and a cathode-side emitting layer (a yellow-to-red emitting layer). The chromaticity of the device was (0.28, 0.28). White emission was obtained. Like in Example 1, for the device obtained, Table 1 shows emission color, luminous efficiency and so on and FIG. 3(f) shows the energy level of the electron barrier layer and layers on both sides thereof.

TABLE 1

|  | IP/Af of a-EML*) (eV) | Difference ΔIP in IP between a-EML*) and EBL**) (eV) | IP/Af of EBL**) (eV) | Difference ΔIP in IP between c-EML***) and EBL**) (ev) | Difference ΔAf in Af between c-EML**) and EBL**) (ev) | IP/Af of c-EML***) (ev) | Chromaticity at 100 cd/m² · hr | Luminous efficiency at 100 cd/m² · hr |
|---|---|---|---|---|---|---|---|---|
| Example 1 | 5.7/2.7 (compound [32]:R1[34]) | 0.5 | 5.2/2.2 (NPD) | 0.5 | 0.5 | 5.7/2.7 (compound [32]:B1[33]) | (0.29, 0.29) white | 9.5 |
| Example 2 | 5.7/2.7 (compound [32]:R1[34]) | 0 | 5.7/1.9 (TAZ) | 0 | 0.8 | 5.7/2.7 (compound [32]:B1[33]) | (0.30, 0.30) white | 11.2 |
| Example 3 | 5.66/2.73 (compound [32]:B1[33]) | 0.04 | 5.7/1.9 (TAZ) | 0 | 0.8 | 5.7/2.7 (compound [32]:R1[34]) | (0.32, 0.34) white | 10.2 |
| Example 4 | 5.66/2.73 (compound [32]:B1[33]) | 0.46 | 5.2/2.2 (NPD) | 0.5 | 0.5 | 5.7/2.7 (Alq:R1[34]) | (0.33, 0.35) white | 8.5 |
| Comparative example 1 | 5.7/2.7 (compound [32]:R1[34]) | — | — | — | — | 5.7/2.7 (compound [32]:B1[33]) | (0.50, 0.42) yellow | 8.0 |

TABLE 1-continued

| | IP/Af of a-EML[*] (eV) | Difference ΔIP in IP between a-EML[*] and EBL[] (eV) | IP/Af of EBL[] (eV) | Difference ΔIP in IP between c-EML[*] and EBL[] (ev) | Difference ΔAf in Af between c-EML[] and EBL[] (ev) | IP/Af of c-EML[***] (ev) | Chromaticity at 100 cd/m$^2$·hr | Luminous efficiency at 100 cd/m$^2$·hr |
|---|---|---|---|---|---|---|---|---|
| Comparative example 2 | 5.7/2.7 (compound [32]:B1[33]) | — | — | — | — | 5.7/2.7 (compound [32]:R1[34]) | (0.28, 0.28) white | 6.0 |

[*]a-EML: Anode-side emitting layer
[**]EBL: Electron barrier layer
[***]c-EML: Cathode-side emitting layer From the results shown in Table 1, it was found that an organic EL device that emits white light with a high luminous efficiency can be obtained by arranging two organic emitting layers formed of electron-transporting materials with an electron barrier layer interposed therebetween.

Example 5

Instead of forming the NPD film, which is a hole-transporting layer in Example 1, after forming the TPD232 film as a hole-injecting layer, a tri-(carbazolylphenyl)amine (TCTA, represented by the following formula) film was formed in a thickness of 20 nm on the TPD232 film. After forming the TCTA film, a carbazole derivative represented by the following formula [35] and an iridium complex represented by the following formula [36] were deposited in a thickness of 30 nm at a weight ratio of 50:4 to form a blue emitting layer (IP/Af(eV)=5.8/2.6). Next, a carbazole derivative represented by the following formula [38] was formed in a thickness of 5 nm. This film functioned as an electron barrier layer (IP/Af(eV)=5.7/2.2). Next, a carbazole derivative [35] and an iridium complex represented by the following formula [37] were deposited in a thickness of 30 nm at a weight ratio of 30:3 to form a yellow-to-red emitting layer (Ip/Af(eV)=5.8/2.6). Next, on this film, a film of aluminum (III) bis(2-methyl-8-quinolinate)-4-phenylphenolate (BAlq, represented by the following formulas) was formed in a thickness of 10 nm. Thereafter, Li (Li source, manufactured by Saes getter Co.) and Alq were co-deposited to form an Alq:Li film with a thickness of 10 nm as an electron-injecting layer. Metal Al was deposited in a thickness of 150 nm on this Alq:Li film to form a metal cathode, thereby fabricating an organic EL emitting layer.

[TCTA]

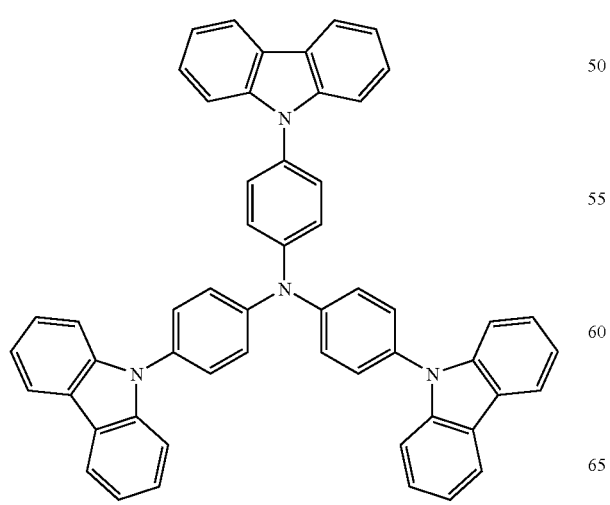

-continued

[35]

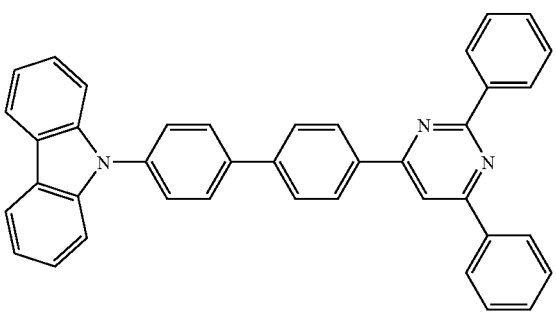

[36]

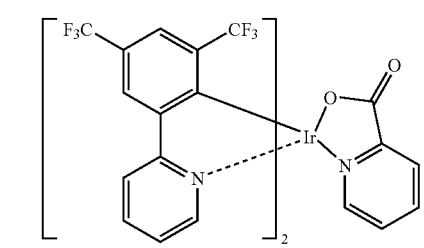

[37]

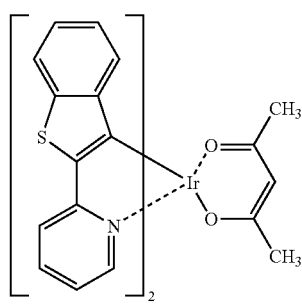

[BAlq]

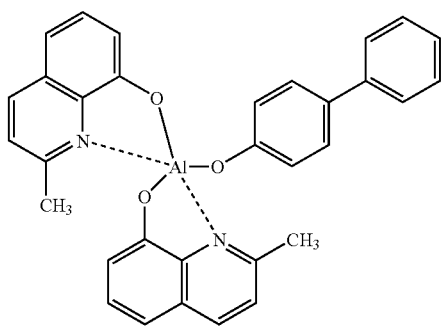

-continued

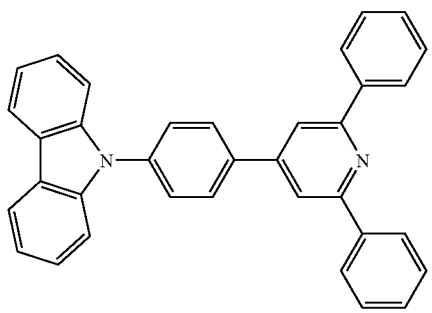

[38]

The device obtained had an emission luminance of 100 cd/m² at a direct voltage of 11 V, an efficiency of 25.2 cd/A and a chromaticity of (0.35, 0.40). White emission could be obtained with a very high efficiency. Table 2 shows the CIE1931 chromaticity coordinates (x, y), emission color, luminous efficiency at an emission luminance of 100 cd/m², difference ΔAf in affinity level between the electron barrier layer and cathode-side emitting layer, and difference ΔIP in ionization potential between the anode-side and cathode-side emitting layers of the devices obtained.

Comparative Example 3

An organic EL device was fabricated in the same way as in Example 5 except that an electron barrier layer was not formed between an anode-side emitting layer and a cathode-side emitting layer. The device had an emission luminance of 100 cd/m² at a direct voltage of 13 V, efficiency of 2.2 cd/A and chromaticity of (0.60, 0.34). White emission could not be obtained and the efficiency was low.

layer between two emitting layers, and in particular a high efficiency can be achieved by setting the ionization potential of the electron barrier layer close to those of the emitting layers. A white device with a high efficiency can be easily realized even when using an emitting layer of phosphorescent type.

The invention provides a white organic EL device with small change in chromaticity, which device can be suitably used for information displays, displays for automobiles, lighting devices and the like.

The invention claimed is:
1. An organic electroluminescent device comprising:
a pair of electrodes, and
at least two organic emitting layers held between the pair of electrodes, wherein
two organic emitting layers are arranged with an electron barrier layer interposed therebetween,
the two organic emitting layers both comprise an electron-transporting emitting material, and
the electron barrier layer has an affinity level of at least 0.2 eV less than the affinity level of the organic emitting layer arranged on a cathode side relative to the electron barrier layer.
2. The organic electroluminescent device according to claim 1, wherein the two organic emitting layers both have an electron mobility of $10^{-6}$ cm²/V·sec or more.
3. The organic electroluminescent device according to claim 1, wherein a difference in ionization potential between the electron barrier layer and the organic emitting layer arranged on an anode side relative to the electron barrier layer is 0.2 eV or less.
4. The organic electroluminescent device according to claim 1, wherein a difference in ionization potential between

TABLE 2

| | IP/Af of a-EML*) (eV) | Difference ΔIP in IP between a-EML*) and EBL**) (eV) | IP/Af of EBL**) (eV) | Difference ΔIP in IP between c-EML***) and EBL**) (eV) | Difference ΔAf in Af between c-EML***) and EBL**) (eV) | IP/Af c-EML***) (ev) | Chromaticity at 100 cd/m²·hr | Luminous efficiency at 100 cd/m²·hr |
|---|---|---|---|---|---|---|---|---|
| Example 5 | 5.8/2.6 (compound [35]:compound [36]) | 0.1 | 5.7/2.2 (compound [38]) | 0.1 | 0.4 | 5.8/2.6 (compound [35]:compound [37]) | (0.35, 0.40) white | 25.2 |
| Comparative example 3 | 5.8/2.6 (compound [35]:compound [36]) | — | — | — | — | 5.8/2.6 (compound [35]:compound [37]) | (0.60, 0.34) orange | 2.2 |

*)a-EML: Anode-side emitting layer
**)EBL: Electron barrier layer
***)c-EML: Cathode-side emitting layer The results of Table 2 show that even when a phosphorescent host material and a phosphorescent dopant are used in an emitting layer, an organic EL device that emits white light with a high luminous efficiency can be obtained by arranging two organic emitting layers formed of electron-transporting materials with an electron barrier layer interposed therebetween.

INDUSTRIAL UTILITY

According to the invention, a white device of a simple structure can be realized by interposing an electron barrier the electron barrier layer and the organic emitting layer arranged on a cathode side relative to the electron barrier layer is 0.2 eV or less.
5. The organic electroluminescent device according to claim 1, wherein the organic emitting layer arranged on an anode side relative to the electron barrier layer emits blue light.
6. The organic electroluminescent device according to claim 5, wherein the organic emitting layer arranged on a cathode side relative to the electron barrier layer emits yellow to red light.

7. The organic electroluminescent device according to claim 1, wherein the organic emitting layer arranged on an anode side relative to the electron barrier layer emits yellow to red light.

8. The organic electroluminescent device according to claim 7, wherein the organic emitting layer arranged on a cathode side relative to the electron barrier layer emits blue light.

9. The organic electroluminescent device according to claim 5, wherein the maximum wavelength of the blue light is 450 nm to 500 nm.

10. The organic electroluminescent device according to claim 6, wherein the maximum wavelength of the yellow to red light is 540 nm to 700 nm.

11. The organic electroluminescent device according to claim 1 that emits white light.

12. A display comprising the organic electroluminescent device of claim 1.

13. The organic electroluminescent device according to claim 8, wherein the maximum wavelength of the blue light is 450 nm to 500 nm.

14. The organic electroluminescent device according to claim 7, wherein the maximum wavelength of the yellow to red light is 540 nm to 700 nm.

* * * * *